(12) United States Patent
Sotzing et al.

(10) Patent No.: US 8,890,130 B2
(45) Date of Patent: Nov. 18, 2014

(54) FORMATION OF CONJUGATED POLYMERS FOR SOLID-STATE DEVICES

(71) Applicant: The University of Connecticut, Farmington, CT (US)

(72) Inventors: Gregory Allen Sotzing, Storrs, CT (US); Michael A. Invernale, West Haven, CT (US)

(73) Assignee: The University of Connecticut, Farmington, CT (US)

( * ) Notice: Subject to any disclaimer, the term of this patent is extended or adjusted under 35 U.S.C. 154(b) by 0 days.

(21) Appl. No.: 13/772,710

(22) Filed: Feb. 21, 2013

(65) Prior Publication Data

US 2013/0161600 A1 Jun. 27, 2013

Related U.S. Application Data

(62) Division of application No. 13/069,627, filed on Mar. 23, 2011, now Pat. No. 8,404,515.

(60) Provisional application No. 61/317,457, filed on Mar. 25, 2010.

(51) Int. Cl.
*H01L 51/00* (2006.01)
*C25B 3/00* (2006.01)
*G02F 1/15* (2006.01)

(52) U.S. Cl.
CPC .... *H01L 51/0034* (2013.01); *G02F 2001/1515* (2013.01); *C08G 2261/44* (2013.01); *G02F 1/15* (2013.01); *G02F 2001/1519* (2013.01); *C08G 2261/54* (2013.01); *C25B 3/00* (2013.01); *C08G 2261/3223* (2013.01)
USPC .................... 257/40; 257/E51.024

(58) Field of Classification Search
USPC ............................................ 257/40, E51.024
See application file for complete search history.

(56) References Cited

U.S. PATENT DOCUMENTS

| | | | |
|---|---|---|---|
| 6,368,363 | B1 | 4/2002 | Kobatake et al. |
| 6,433,913 | B1 | 8/2002 | Bauer et al. |

(Continued)

FOREIGN PATENT DOCUMENTS

| | | |
|---|---|---|
| EP | 1760110 A1 | 3/2007 |
| EP | 1928000 A1 | 6/2008 |

(Continued)

OTHER PUBLICATIONS

Ding et al.; "A simple, low waste and versatile procedure to make polymer electrochromic devices"; Journals of Materials Chemistry; 2011, 21; pp. 11873-11878.

(Continued)

*Primary Examiner* — Long Pham
(74) *Attorney, Agent, or Firm* — Cantor Colburn LLP

(57) ABSTRACT

Disclosed herein is a facile process for the formation of conjugated polymers inside or outside assembled solid-state devices. One process generally involves applying a voltage to a device comprising at least two electrodes, a combination of an electrolyte composition and a electroactive monomer disposed between the electrodes, and a potential source in electrical connection with the at least two electrodes; wherein the applying voltage polymerizes the electroactive monomer into a conjugated polymer. Also disclosed are electrochromic articles prepared from the process and solid-state devices comprising a composite of an electrolyte composition and a conjugated polymer.

10 Claims, 4 Drawing Sheets

(56) References Cited

U.S. PATENT DOCUMENTS

| | | | |
|---|---|---|---|
| 7,321,012 | B2 | 1/2008 | Sotzing |
| 7,411,716 | B2 | 8/2008 | Oh et al. |
| 7,586,663 | B1 | 9/2009 | Radmard et al. |
| 7,626,748 | B2 | 12/2009 | Radmard et al. |
| 7,630,117 | B2 | 12/2009 | Oh et al. |
| 7,874,666 | B2 | 1/2011 | Xu et al. |
| 2006/0047030 | A1 | 3/2006 | Yoshida et al. |
| 2007/0008603 | A1 | 1/2007 | Sotzing et al. |
| 2007/0089845 | A1 | 4/2007 | Sotzing et al. |
| 2010/0245971 | A1 | 9/2010 | Sotzing et al. |

FOREIGN PATENT DOCUMENTS

| | | |
|---|---|---|
| EP | 2196847 A1 | 6/2010 |
| JP | S63128034 A | 5/1988 |
| JP | 2007041579 | 2/2007 |
| JP | 2007163865 | 6/2007 |
| KR | 2007007131 | 7/2007 |
| WO | 2007008977 A1 | 1/2007 |
| WO | 2009124850 A1 | 10/2009 |
| WO | 2011119664 A2 | 9/2011 |

OTHER PUBLICATIONS

Invernale et al., "Polythieno[3,4-b]thiophene as an Optically Transparent Ion-Storage Layer", Chemistry of Materials, 21, 2009, pp. 3332-3336.

Invernale et al., "Preparation of Conjugated Polymers Inside Assembled Solid-State Devices", Advanced Materials 22, 2010, pp. 1379-1382.

JP3132724, Jun. 6, 1991, Abstract Only, 1 page.

JP61252535, Nov. 10, 1996, Abstract Only, 1 page.

JP63225688, Sep. 20, 1988, Abstract Only, 1 page.

KR20070071731, Jul. 4, 2007, Abstract Only, 1 page.

Krishnamoorthy et al.; "Rational design of an electrochromic polymer with high contrast in the visible region: dibenzyl substituted poly (3,4-propylenedioxythiophehe)"; Journal of Chemistry; 2001; pp. 2909-2911.

Kumar Anil et al.; "Conducting Poly(3-4-alkylenedioxythiophene) Derivatives as Fast Electrochromics with High-Contrast Ratios"; Chem Mater.; 1998, 10, pp. 896-902.

Padilla et al.; "Electrochemical study of dual conjugated polymer electrochromic devices"; Journal of Electroanalytical Chemistry; (2007); 609(2); pp. 75-84.

International Search Report for International Application PCT/US2011/029512; International Filing Date Mar. 23, 2010; Date of Mailing Oct. 28, 2011; 5 pages.

Written Opinion for International Application Ni. PCT/US2011/029512; International Filing Date Mar. 23, 2010; Date of Mailing Oct. 28, 2011; 4 pages.

Sapp et al.; "Rapid Switching Solid State Electrochromic Devices Based on Complementary Conducting Polymer Films"; Advanced Materials (Weinheim, Germany) (1996), 8(10), pp. 808-811.

Sapp, Shawn A. et al.; "High Contrast Ratio and Fast-Switching Dual Polymer Electrochromic Devices"; Chem. Mater; 1998, 10; pp. 2101-2108.

Seshadri et al.; "Optimization, preparation, and electrical short evaluation for 30cm2 active area dual conjugated polymer electrochromic windows"; Organic Electronics (2007), 8(4), pp. 367-381.

Sotzing webpage "Electrochromic Devices"; Institute of Materials Sciences; University of Connecticut; downloaded from http://www.ims.uconn.edu/~sotzing_grp/research/ECDevices.html; on May 31, 2011; 2 pages.

Welsh Dean M. et al.; "Enhanced Contrast Ratios and Rapid Wwitching in Electrochromics Based on Poly(3,4-propylemedioxythiophene) Derivatives"; Advanced Materials; 1999, II, No. 16; pp. 1379-1382.

WO2009031422, Mar. 12, 2009, Abstract Only, 1 page.

European Search Report for European Patent Application No. 11760103.9, Search Report Date Jan. 14, 2014, 8 pages.

XP002718034 & JPS63128034, Database WPI Week 198832, Nov. 25, 1988, Abstract, Examples 1, 2; 3 pages.

FORMATION OF CONJUGATED POLYMERS FOR SOLID-STATE DEVICES

CROSS REFERENCE TO RELATED APPLICATION

This application is a divisional application of application Ser. No. 13/069,627 filed Mar. 23, 2011 which claims the benefit of U.S. Provisional Application Ser. No. 61/317,457 filed Mar. 25, 2010, each of which is hereby incorporated by reference in its entirety.

TECHNICAL FIELD

The present invention is in the field of electrochromic devices, and more specifically, in the field of electrochromic devices utilizing a conjugated polymer formed inside or outside an assembled solid-state device.

BACKGROUND

An electrochromic device is a self-contained, two-electrode (or more) electrolytic cell that includes an electrolyte and one or more electrochromic materials. Electrochromic materials can be organic or inorganic, and reversibly change visible color when oxidized or reduced in response to an applied electrical potential. Electrochromic devices are therefore constructed so as to modulate incident electromagnetic radiation via transmission, absorption, or reflection of the light upon the application of an electric field across the electrodes. The electrodes and electrochromic materials used in the devices are dependent on the type of device, i.e., absorptive/transmissive or absorptive/reflective.

Absorptive/transmissive electrochromic devices typically operate by reversibly switching the electrochromic materials between colored and bleached (colorless) states. Typical electrochromic materials used in these devices include indium-doped tin oxide (ITO), fluorine-doped tin oxide ($SnO_2$:F), poly(3,4-ethylenedioxythiophene)-poly(styrene sulfonate) (PEDOT-PSS), and single-walled carbon nanotubes (SWNT). An exemplary electrochromic device of this type has been constructed using a substrate layer of polyethylene terephthalate (PET), a transparent layer of ITO as the working electrode, and a third layer of PEDOT-PSS as the counter electrode.

The absorptive/reflective-type electrochromic devices typically contain a reflective metal as an electrode. The electrochromic material is deposited onto this electrode and is faced outward to allow incident light to reflect off the electrochromic material/electrode surface. The counter electrode is behind the active electrode. Similar electrode and electrochromic materials can be used in these reflective devices, in particular ITO and PEDOT-PSS.

Traditionally built electrochromic devices utilizing an electrochromic polymer have a discrete electrochromic polymer layer assembled with an electrolyte on top. Devices are assembled between two electrodes using the electrolyte between them to achieve the necessary ion shuttling for the redox-active electrochromic polymers. This electrolyte is often cross-linked into a gel.

In traditional processes to prepare the foregoing electrochromic devices using an electrochromic polymer such as PEDOT, the electrochromic polymer is formed into a discrete thin film prior to device assembly. Typical processes to prepare the thin film are via electrodeposition, spin or spray casting from solutions, etc. Drawbacks to using electrodeposition include the use of costly and wasteful electrolyte baths, the need for the frequent changing of organic salts and solvents in the baths, as well as the need for proper disposal of spent baths. Electrodeposition processes are also known to have poor yields.

Other processes besides electrodeposition involve complex syntheses to generate soluble versions of an electrochromic polymer which can then be cast and assembled into a device. The use of so-called precursor polymers can be used in a casting process and then converted to their electrochromic counterpart. However, such a process still involved the initial preparation of an electrochromic polymer film prior to device assembly.

There remains a need in the art for processes to prepare electrochromic devices. There also remains a need for electrochromic devices having improved properties.

BRIEF SUMMARY

In one embodiment, a method of forming a solid-state device comprises applying voltage to a device comprising at least two electrodes, a combination of an electrolyte composition and an electroactive monomer, the combination disposed between the at least two electrodes, and a potential source in electrical connection with the at least two electrodes; wherein the applying voltage polymerizes the electroactive monomer to form a composite comprising conjugated polymer and electrolyte composition.

In one embodiment, a method of forming a solid-state device comprises applying voltage to a device comprising at least two electrodes, a combination of a crosslinked gel electrolyte composition and an electroactive monomer, the combination disposed between the at least two electrodes, and a potential source in electrical connection with the at least two electrodes; wherein the applying voltage polymerizes the electroactive monomer to form a composite comprising conjugated polymer and crosslinked gel electrolyte composition.

In yet another embodiment, a solid-state device comprises at least two electrodes; and a composite disposed between the at least two electrodes, the composite comprising a conjugated polymer and an electrolyte composition; wherein the composite is formed by in situ polymerization of an electroactive monomer in a combination comprising the electrolyte composition and an electroactive monomer.

In still another embodiment, a solid-state device comprises at least two electrodes; and a composite disposed between the at least two electrodes, the composite comprising a conjugated polymer and a crosslinked gel electrolyte composition; wherein the composite is formed by in situ polymerization of an electroactive monomer in a combination comprising the crosslinked gel electrolyte composition and an electroactive monomer, wherein the conjugated polymer is not formed as a discrete film.

BRIEF DESCRIPTION OF THE DRAWINGS

The components in the drawings are not necessarily to scale, emphasis instead being placed upon clearly illustrating the principles of the embodiments described herein. Moreover, in the drawings, like reference numerals designate corresponding parts throughout the several views.

DETAILED DESCRIPTION

Figure 1:
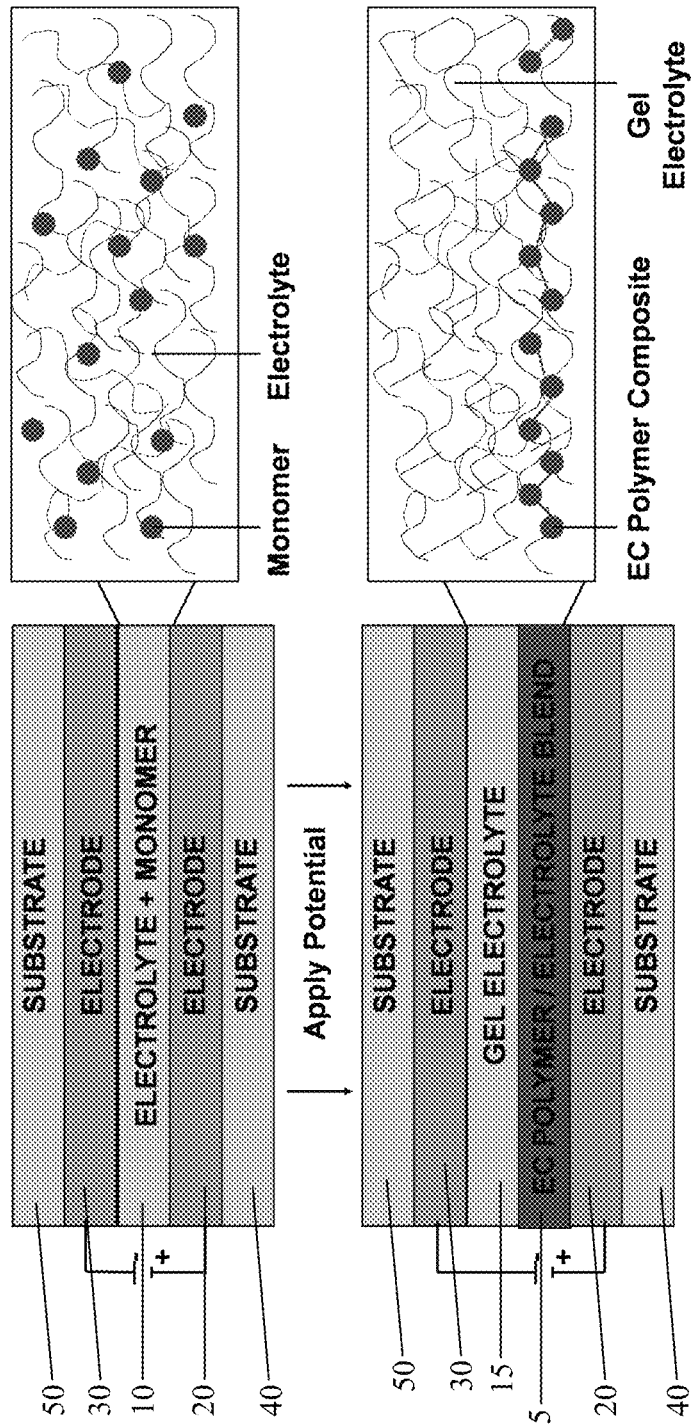
FIG. 1 is a schematic of a procedure for the in situ polymerization of a electroactive monomer into a conjugated, conducting, electrochromic polymer inside an assembled solid-state device.

Disclosed herein is a facile, cost effective, and industrially scalable method for the formation of solid-state devices comprising a conjugated polymer by the in situ polymerization of an electroactive monomer. As used herein, a conjugated polymer is synonymous to an electrochromic polymer, an electroactive polymer, or a conducting polymer. The conjugated polymer is formed inside the solid-state device by applying a voltage to the device to polymerize the electroactive monomer present in a mixture comprising a combination of an electrolyte composition and electroactive monomer. The device can be fully assembled prior to the application of the voltage which effects the formation of the conjugated polymer via electrochemical polymerization. Such a process avoids many of the usual processing steps required to make such solid-state devices (e.g., an electrochromic device (ECD). Such steps that are avoided include formation of a discrete, thin film of conjugated polymer on a substrate, formation of an electrolyte bath used for electrodeposition, disposal of the electrolyte bath, etc. There is also no need for special processing steps for device assembly, special synthetic steps for conjugated polymer preparation, and there is a significant avoidance of chemical waste in that electrolytic baths containing solvents and organic salts are not used.

Also disclosed herein are solid-state devices prepared from the method. To prepare a device, only a mixture that comprises a combination of an electroactive monomer and an electrolyte composition is needed. Unlike traditionally formed conjugated polymer films prepared via electrochemical deposition that are then used to form an assembled device, the conjugated polymer is not formed as a discrete thin-film, but rather a polymer composite with the electrolyte composition. For example, when a gel electrolyte is used, the conjugated polymer is formed as a composite with the gel electrolyte matrix. With this process, it is possible to form a variety of complex blends.

Exemplary solid-state devices which can be prepared include ECDs, organic thin-film transistors (OTFTs), organic light-emitting diodes (OLEDs), solar cells, and organic photovoltaic cells (OPVs), the devices described further herein, below, and other solid-state devices.

A further advantage of the process is that it can be used with solid or liquid electroactive monomers by selecting the appropriate electrolyte composition that would dissolve or disperse the electroactive monomer. Other advantages include the simplicity of color tuning via color mixing obtained by the copolymerization of various electroactive monomers. Still a further advantage is the formation of higher Photopic contrast when in situ polymerization is used, particularly when the electroactive monomers are electropolymerized within the composite of crosslinked electrolyte matrix and electroactive monomer. Not wishing to be bound by theory, it is hypothesized that the formation of a higher Photopic contrast is due to less pi-pi stacking between the conjugated polymer chains, caused by the physical conformation of the polymer composite. Inter-chain interactions are therefore separated, and in the oxidized (conducting, bleached) state, this results in less inter-chain mobility of the holes (absence of electrons) meaning there are fewer low-energy absorptions that will contribute to visible absorption in the oxidized state and ultimately a higher Photopic contrast is observed.

When in situ polymerization is used, it was unexpected that an optically even layer of conjugated polymer could be prepared in an assembled, sealed device as the presence of the crosslinked gel electrolyte across the surface of the electrode would seem to be a barrier. However, the devices prepared according to the instant process using a monomer within the gel electrolyte show an unprecedented evenness. The formation of the aforementioned composite in the matrix accounts for this evenness.

In one embodiment, a method to make a solid-state device comprises providing a device comprising at least two electrodes, a combination of an electrolyte composition and an electroactive monomer disposed between the electrodes, and a potential source in electrical connection with the at least two electrodes; and applying a voltage to the device to polymerize the electroactive monomer to form a composite of a conjugated polymer and electrolyte composition. Further within this embodiment, the providing a device comprises mixing an electrolyte composition and an electroactive monomer to form a combination of the electrolyte composition and the electroactive monomer. The method further comprises disposing the combination of the electrolyte composition and the electroactive monomer between the at least two electrodes.

When in situ polymerization is used, the application of a voltage causes diffusive migration of the electroactive monomer present to the working electrode and the subsequent formation of the conjugated polymer in and around the crosslinked matrix of the gel electrolyte to form a composite. In another embodiment, a gel electrolyte precursor is used and the voltage is applied to form the conjugated polymer prior to the crosslinking of the gel electrolyte precursor to gel electrolyte. In another embodiment, the polymerization of the electroactive monomer and the crosslinking of the gel electrolyte precursor are performed at the same time.

The electrolyte compositions for use in the solid-state device include those known for use in electrochromic devices. The electrolyte composition may include metal salts, organic salts (e.g., ionic liquids), inorganic salts, and the like, and a combination thereof.

In one embodiment the electrolyte composition is a gel electrolyte. The gel electrolyte layer can be formed by coating a gel electrolyte precursor mixture comprising a gel electrolyte precursor. The gel electrolyte precursor can be monomeric or polymeric. In particular, the gel precursor is a crosslinkable polymer. The crosslinkable polymer can comprise polymerizable end groups, polymerizable side-chain groups, or a combination thereof attached to a polymer backbone. Exemplary polymer backbones include polyamides, polyimides, polycarbonates, polyesters, polyethers, polymethacrylates, polyacrylates, polysilanes, polysiloxanes, polyvinylacetates, polymethacrylonitriles, polyacrylonitriles, polyvinylphenols, polyvinylalcohols, polyvinylidenehalides, and co-polymers and combinations thereof. More specifically, the gel precursor is a cross-linkable polyether. Exemplary polyethers include poly(alkylene ethers) and poly (alkylene glycol)s comprising ethyleneoxy, propyleneoxy, and butyleneoxy repeating units. Hydroxyl end groups of poly(alkylene glycols) can be capped with polymerizable vinyl groups including (meth)acrylate and styryl vinyl groups to form a crosslinkable polyether. In particular, the crosslinkable polymer is selected from the group consisting of poly(ethylene glycol) diacrylate (PEG-DA), poly(propylene glycol) diacrylate (PPG-DA), poly(butylene glycol) diacrylate (PBG-DA), poly(ethylene oxide) (PEO), poly(propylene oxide) (PPO), poly(butylene oxide) (PBO), and combinations thereof. The crosslinkable polymer can also be a copolymer or a block copolymer comprising ethyleneoxy, propylenoxy, or butyleneoxy repeating units. In one embodiment, the gel precursor is PEO and is crosslinked thermally. In one embodiment, the gel precursor is PEO and is crosslinked using UV radiation. In a specific embodiment, the gel precursor is crosslinkable polymer comprising a mixture of PEG-DA and PEO, wherein the PEO:PEG-DA weight ratio is from 95:5 to 5:95, more particularly 90:10 to 10:90, and even more particularly 60:40 to 40:60 or 50:50.

The electrolyte composition can comprise an alkali metal ion of Li, Na, or K. Exemplary electrolytes, where M represents an alkali metal ion, include $MClO_4$, $MPF_6$, $MBF_4$, $MAsF_6$, $MSbF_6$, $MCF_3SO_3$, $MCF_3CO_2$, $M_2C_2F_4(SO_3)_2$, $MN(CF_3SO_2)_2$, $MN(C_2F_5SO_2)_2$, $MC(CF_3SO_2)_3$, $MC_nF_{2n+1}SO_3$ ($2 \leq n \leq 3$), $MN(RfOSO_2)_2$ (wherein Rf is a fluoroalkyl group), MOH, or combinations of the foregoing electrolytes. In particular, the electrolyte composition comprises a lithium salt. More particularly, the lithium salt is lithium trifluoromethanesulfonate. Other suitable salts include tetra-n-butylammonium tetrafluoroborate ($TBABF_4$); tetra-n-butylammonium hexafluorophosphate ($TBAPF_6$); and combinations thereof. When a gel electrolyte is used, the concentration of the electrolyte salt may be about 0.01 to about 30% by weight of the gel electrolyte precursor, specifically about 5 to about 20% by weight, and yet more specifically about 10 to about 15% by weight of the gel electrolyte precursor.

The gel electrolyte precursor mixture can also comprise a solvent or plasticizer to enhance the ionic conductivity of the electrolyte. These may be high boiling organic liquids such as carbonates, their blends or other materials like dimethylformamide (DMF). In particular the solvent can be a carbonate, for example alkylene and alkylyne carbonates such as dimethyl carbonate, ethylmethyl carbonate, methylpropyl carbonate, methylbutyl carbonate, methylpentyl carbonate, diethyl carbonate, ethylpropyl carbonate, ethylbutyl carbonate, dipropyl carbonate, propylene carbonate, ethylene carbonate, propylyne carbonate, and combinations thereof. The amount of solvent and/or plasticizer added to the gel electrolyte precursor mixture can range from about 0 to about 50% by weight of the gel electrolyte precursor mixture, specifically about 10 to about 40% by weight, and more specifically about 20 to about 30% by weight of the gel electrolyte precursor mixture.

The gel electrolyte precursor mixture can further comprise other additives such as photochemical sensitizers, free radical initiators, and diluent polymers, providing the desired properties of the electrochromic device are not significantly adversely affected; for example, the ionic conductivity of the gel electrolyte, the switching speed of the electrochromic response, color contrast of the electrochromic response, adhesion of the gel electrolyte to the substrate, and flexibility of the electrodes.

In one embodiment, the gel electrolyte precursor mixture does not comprise a plasticizer. In another embodiment, the gel electrolyte does comprise a plasticizer.

The electrolyte composition may contain an ionic liquid. Ionic liquids are organic salts with melting points under about 100° C. Other ionic liquids have melting points of less than room temperature (~22° C.). Examples of ionic liquids that may be used in the electrolyte composition include imidazolium, pyridinium, phosphonium or tetralkylammonium based compounds, for example, 1-ethyl-3-methylimidazolium tosylate, 1-butyl-3-methylimidazolium octyl sulfate; 1-butyl-3-methylimidazolium 2-(2-methoxyethoxy)ethyl sulfate; 1-ethyl-3-methylimidazolium bis(pentafluoroethylsulfonyl)imide; 1-ethyl-3-methylimidazolium bis(trifluoromethylsulfonyl)imide; 1-ethyl-3-methylimidazolium bromide; 1-ethyl-3-methylimidazolium hexafluorophosphate; 1-butyl-3-methylimidazolium bromide; 1-butyl-3-methylimidazolium trifluoromethane sulfonate; 1,2-dimethyl-3-propylimidazolium tris(trifluoromethylsulfonyl)methide; 1,2-dimethyl-3-propylimidazolium bis(trifluoromethylsulfonyl)imide; 3-methyl-1-propylpyridinium bis(trifluormethylsulfonyl)imide; 1-butyl-3-methylpyridinium bis(trifluormethylsulfonyl)imide; 1-butyl-4-methylpyridinium chloride; 1-butyl-4-methylpyridinium hexafluorophosphate; 1-butyl-4-methylpyridinium tetrafluoroborate; 1-n-butyl-3-methylimidazolium hexafluorophosphate (n-BMIM $PF_6$); 1-butyl-3-methylimidazolium tetrafluoroborate (BMIM $BF_4$); phosphonium dodecylbenzenesulfonate; phosphonium methanesulfonate; and mixtures of these.

The amount of ionic liquid that can be used in the gel electrolyte precursor mixture can range from about 10% to about 80% by weight, specifically about 20% to about 70% by weight, more specifically about 30% to about 60% by weight, and yet more specifically about 40% to about 50% by weight of the gel electrolyte precursor mixture.

The gel electrolyte precursor can be converted to a gel via radical crosslinking initiated by thermal methods, or in particular by exposure to ultraviolet (UV) radiation. In an exemplary embodiment, the wavelength of UV irradiation is about 365 nm although other wavelengths can be used.

The gel electrolyte precursor mixture may comprise a thermal initiator or a photoinitiator. Exemplary photoinitiators include benzophenone, 2,2-dimethoxy-2-phenylacetophenone (DMPAP), dimethoxyacetophenone, xanthone, and thioxanthone. In one embodiment the initiator may include 2,2-dimethoxy-2-phenyl-acetophenone (DMPAP).

Crosslinking may also be thermally induced at about 40° C. to about 70° C., specifically about 50° C. using a thermal initiator. Exemplary thermal initiators include peroxide initiators such as benzyl peroxide (BPO), or azo bis isobutylnitrile (AIBN).

In one embodiment, the gel electrolyte precursor mixture comprises the electrolyte salt (e.g. metal salts, organic salts (e.g., ionic liquids), inorganic salts, or a combination thereof) and the gel precursor in a weight ratio of 1 to 10, with a 0.002 to 1 to 10 ratio of initiator to electrolyte to gel precursor, by weight.

Exemplary gel polymer electrolytes include those described in U.S. Pat. No. 7,586,663 and U.S. Pat. No. 7,626,748, both to Radmard et al.

The electroactive monomer is polymerized in situ in the assembled device by applying voltage (oxidative potential) across the device. The electroactive monomer irreversibly converts to the conjugated polymer and can be switched as normal, with a moderate reduction in optical contrast.

Examples of suitable electroactive monomers include those known in the art to exhibit electroactivity when polymerized, including but not limited to thiophene, substituted thiophene, carbazole, 3,4-ethylenedioxythiophene, thieno[3,4-b]thiophene, substituted thieno[3,4-b]thiophene, dithieno[3,4-b:3',4'-d]thiophene, thieno[3,4-b]furan, substituted thieno[3,4-b]furan, bithiophene, substituted bithiophene, pyrrole, substituted pyrrole, acetylene, phenylene, substituted phenylene, naphthalene, substituted naphthalene, biphenyl and terphenyl and their substituted versions, phenylene vinylene (e.g., p-phenylene vinylene), substituted phenylene vinylene, aniline, substituted aniline, indole, substituted indole, the monomers disclosed herein as structures (I)-(XXXI), combinations thereof, and the like.

The electroactive monomer can be selected from cathodically coloring materials, anodically coloring materials, or a combination thereof.

Cathodically coloring materials have a band gap ($E_g$) less than or equal to 2.0 eV in the neutral state. A cathodically coloring material changes color when oxidized (p-doped). The change in visible color can be from colored in the neutral state to colorless in the oxidized state, or from one color in the neutral state to a different color in the oxidized state. Cathodically coloring materials include, but are not limited to, polymers derived from a 3,4-alkylenedioxyheterocycle such as an alkylenedioxypyrrole, alkylenedioxythiophene or alkylenedioxyfuran. These further include polymers derived from 3,4-alkylenedioxyheterocycles comprising a bridge-alkyl substituted 3,4-alkylenedioxythiophene, such as 3,4-(2,2-dimethylpropylene)dioxythiophene (PropOT-(Me)$_2$), 3,4-(2,2-dihexylpropylene)dioxythiophene (PropOT-(hexyl)$_2$), or 3,4-(2,2-bis(2-ethylhexyl)propylene)dioxythiophene (PropOT-(ethylhexyl)$_2$). Herein, "colored" means the material absorbs one or more radiation wavelengths in the visible region (400 nm to 700 nm) in sufficient quantity that the reflected or transmitted visible light by the material is visually detectable to the human eye as a color (red, green, blue or a combination thereof).

An anodically coloring material has a band gap $E_g$ greater than 3.0 eV in its neutral state. An anodically coloring material changes color when reduced (n-doped). The material can be colored in the neutral state and colorless in reduced state, or have one color in the neutral state and a different color in the reduced state. An anodically coloring material can also comprise polymers derived from a 3,4-alkylenedioxyheterocycle or derived from an alkylenedioxyheterocycle such as alkylenedioxypyrrole, alkylenedioxythiophene or alkylenedioxyfuran. Exemplary 3,4-alkylenedioxyheterocycle monomers to prepare anodically coloring polymers include an N-alkyl substituted 3,4-alkylenedioxypyrrole, such as N-propyl-3,4-propylenedioxypyrrole (N-Pr PropOP), N-Gly-3,4-propylenedioxypyrrole (N-Gly PropOP), where N-Gly designates a glycinamide adduct of pyrrole group, or N-propane sulfonated PropOP (PropOP-NPrS).

In one embodiment EDOT is used to prepare a cathodically coloring conjugated polymer and 3,6-bis(2-(3,4-ethylenedioxy)thienyl)-N-methylcarbazole (BEDOT-NMCz) is used to prepare an anodically coloring conjugated polymer which is complementary to PEDOT when on the counter electrode.

Suitable electroactive monomers include 3,4-ethylenedioxythiophene, 3,4-ethylenedithiathiophene, 3,4-ethylenedioxypyrrole, 3,4-ethylenedithiapyrrole, 3,4-ethylenedioxyfuran, 3,4-ethylenedithiafuran, and derivatives having the general structure (I):

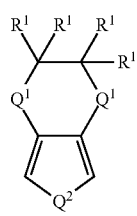

(I)

wherein each occurrence of $Q^1$ is independently S, O, or Se; $Q^2$ is S, O, or N—$R^2$ wherein $R^2$ is hydrogen or $C_1$-$C_6$ alkyl;

and each occurrence of $R^1$ is independently hydrogen, $C_1$-$C_{12}$ alkyl, $C_1$-$C_{12}$ alkyl-OH, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, each occurrence of $R^1$ is hydrogen. In one embodiment, each $Q^1$ is O and $Q^2$ is S. In another embodiment, each $Q^1$ is O, $Q^2$ is S, and one $R^1$ is $C_1$-$C_{12}$ alkyl, $C_1$-$C_{12}$ alkyl-OH, $C_1$-$C_{12}$ haloalkyl, $C_1$-$C_{12}$ alkoxy, $C_1$-$C_{12}$ haloalkoxy, —$C_1$-$C_6$ alkyl-O—$C_1$-$C_6$ alkyl, while the remaining $R^1$ are hydrogen. In another embodiment, each $Q^1$ is O, $Q^2$ is S, and one $R^1$ is $C_1$ alkyl-OH, while the remaining $R^1$ are hydrogen. A specific electroactive monomer is 3,4-ethylenedioxythiophene or EDOT.

Another suitable electroactive monomer includes an unsubstituted and 2- or 6-substituted thieno[3,4-b]thiophene and thieno[3,4-b]furan having the general structures (II), (III), and (IV):

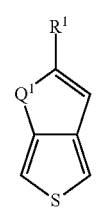

(II)

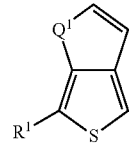

(III)

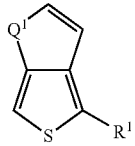

(IV)

wherein $Q^1$ is S, O, or Se; and $R^1$ is hydrogen, $C_1$-$C_{12}$ alkyl, $C_1$-$C_{12}$ haloalkyl including perfluoroalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, $Q^1$ is S and $R^1$ is hydrogen. In another embodiment, $Q^1$ is O and $R^1$ is hydrogen. In yet another embodiment, $Q^1$ is Se and $R^1$ is hydrogen.

Another suitable electroactive monomer includes substituted 3,4-propylenedioxythiophene (PropOT) monomers according to the general structure (V):

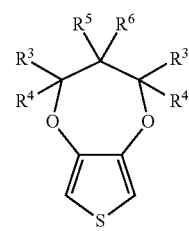

(V)

wherein each instance of $R^3$, $R^4$, $R^5$, and $R^6$ independently is hydrogen; optionally substituted $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl. The $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, or —$C_1$-$C_{10}$ alkyl-aryl groups each may be optionally substituted with one or more of $C_1$-$C_{20}$ alkyl; aryl; halogen; hydroxyl; —N—$(R^2)_2$ wherein each $R^2$ is independently hydrogen or $C_1$-$C_6$ alkyl; cyano; nitro; —COOH; —S(=O)$C_0$-$C_{10}$ alkyl; or —S(=O)$_2$$C_0$-$C_{10}$ alkyl. In one embodiment, $R^5$ and $R^6$ are both hydrogen. In another embodiment, $R^5$ and $R^6$ are both hydrogen, each instance of $R^3$ independently is $C_1$-$C_{10}$ alkyl or benzyl, and each instance of $R^4$ independently is hydrogen, $C_1$-$C_{10}$ alkyl, or benzyl. In another embodiment, $R^5$ and $R^6$ are both hydrogen, each instance of $R^3$ independently is $C_1$-$C_5$ alkyl or benzyl and each instance of $R^4$ independently is hydrogen, $C_1$-$C_5$ alkyl, or benzyl. In yet another embodiment, each instance of $R^3$ and $R^4$ are hydrogen, and one of $R^5$ and $R^6$ is hydroxyl while the other is hydrogen.

Other suitable electroactive monomers include pyrrole, furan, thiophene, and derivatives having the general structure (VI):

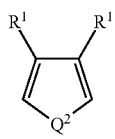

(VI)

wherein $Q^2$ is S, O, or N—$R^2$ wherein $R^2$ is hydrogen or $C_1$-$C_6$ alkyl; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. An exemplary substituted pyrrole includes n-methylpyrrole. Exemplary substituted thiophenes include 3-methylthiophene and 3-hexylthiophene.

Additional electroactive monomers include isathianaphthene, pyridothiophene, pyrizinothiophene, and derivatives having the general structure (VII):

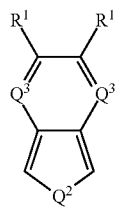

(VII)

wherein $Q^2$ is S, O, or N—$R^2$ wherein $R^2$ is hydrogen or $C_1$-$C_6$ alkyl; each occurrence of $Q^3$ is independently CH or N; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Still other electroactive monomers include oxazole, thiazole, and derivatives having the general structure (VIII):

(VIII)

wherein $Q^1$ is S or O.

Additional electroactive monomers include the class of compounds according to structure (IX):

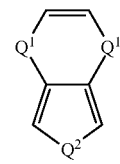

(IX)

wherein $Q^2$ is S, O, or N—$R^2$ wherein $R^2$ is hydrogen or $C_1$-$C_6$ alkyl; and each occurrence of $Q^1$ is independently S or O.

Additional electroactive monomers (or oligomers) include bithiophene, bifuran, bipyrrole, and derivatives having the following general structure (X):

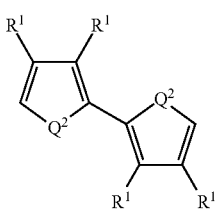

(X)

wherein each occurrence of $Q^2$ is independently S, O, or N—$R^2$ wherein $R^2$ is hydrogen or $C_1$-$C_6$ alkyl; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Electroactive monomers (or oligomers) include terthiophene, terfuran, terpyrrole, and derivatives having the following general structure (XI):

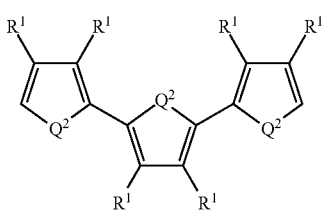

(XI)

wherein each occurrence of $Q^2$ is independently S, O, or N—$R^2$ wherein $R^2$ is hydrogen or $C_1$-$C_6$ alkyl; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Additional electroactive monomers include thienothiophene, thienofuran, thienopyrrole, furanylpyrrole, furanylfuran, pyrolylpyrrole, and derivatives having the following general structure (XII):

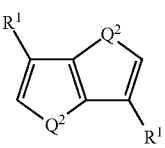

(XII)

wherein each occurrence of $Q^2$ is independently S, O, or N—$R^2$ wherein $R^2$ is hydrogen or $C_1$-$C_6$ alkyl; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Still other electroactive monomers include dithienothiophene, difuranylthiophene, dipyrrolylthiophene, dithienofuran, dipyrrolylfuran, dipyrrolylpyrrole, and derivatives having the following general structure (XIII):

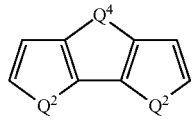

(XIII)

wherein each occurrence of $Q^2$ is independently S, O, or N—$R^2$ wherein $R^2$ is hydrogen or $C_1$-$C_6$ alkyl; $Q^4$ is $C(R^1)_2$, S, O, or N—$R^2$; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Additional electroactive monomers include dithienylcyclopentenone, difuranylcyclopentenone, dipyrrolylcyclopentenone and derivatives having the following general structure (XIV):

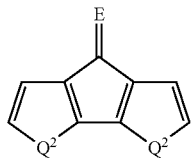

(XIV)

wherein each occurrence of $Q^2$ is independently S, O, or N—$R^2$ wherein $R^2$ is hydrogen or $C_1$-$C_6$ alkyl; and E is O or $C(R^7)_2$, wherein each occurrence of $R^7$ is an electron withdrawing group.

Other suitable electroactive monomers (or oligomers) include those having the following general structure (XV):

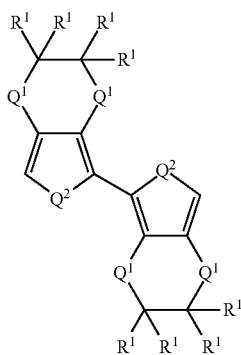

(XV)

wherein each occurrence of $Q^1$ is independently S or O; each occurrence of $Q^2$ is independently S, O, or N—$R^2$ wherein $R^2$ is hydrogen or $C_1$-$C_6$ alkyl; each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, each occurrence of $Q^1$ is O; each occurrence of $Q^2$ is S; and each occurrence of $R^1$ is hydrogen.

Additional electroactive monomers (or oligomers) include dithienovinylene, difuranylvinylene, and dipyrrolylvinylene according to the structure (XVI):

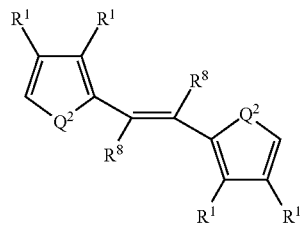

(XVI)

wherein each occurrence of $Q^2$ is independently S, O, or N—$R^2$ wherein $R^2$ is hydrogen or $C_1$-$C_6$ alkyl; each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^8$ is hydrogen, $C_1$-$C_6$ alkyl, or cyano.

Other electroactive monomers (or oligomers) include 1,2-trans(3,4-ethylenedioxythienyl)vinylene, 1,2-trans(3,4-ethylenedioxyfuranyl)vinylene, 1,2-trans(3,4-ethylenedioxypyrrolyl)vinylene, and derivatives according to the structure (XVII):

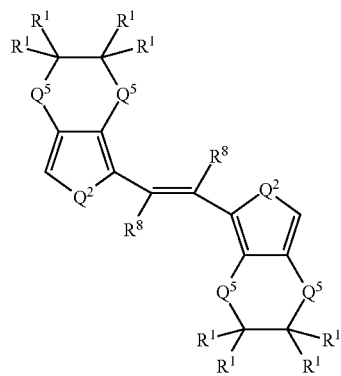

(XVII)

wherein each occurrence of $Q^5$ is independently $CH_2$, S, or O; each occurrence of $Q^2$ is independently S, O, or N—$R^2$ wherein $R^2$ is hydrogen or $C_1$-$C_6$ alkyl; each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^8$ is hydrogen, $C_1$-$C_6$ alkyl, or cyano.

Additional electroactive monomers (or oligomers) include the class bis-thienylarylenes, bis-furanylarylenes, bis-pyrrolylarylenes and derivatives according to the structure (XVIII):

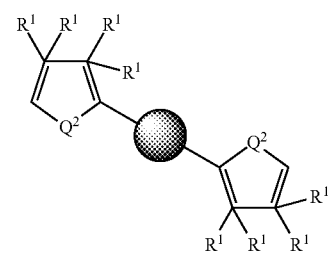

(XVIII)

wherein each occurrence of $Q^2$ is independently S, O, or N—$R^2$ wherein $R^2$ is hydrogen or $C_1$-$C_6$ alkyl; each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and ⬤ represents an aryl. Exemplary aryl groups include furan, pyrrole, N-substituted pyrrole, phenyl, biphenyl, thiophene, fluorene, 9-alkyl-9H-carbazole, and the like.

Other electroactive monomers (or olgiomers) include the class of bis(3,4-ethylenedioxythienyl)arylenes, related compounds, and derivatives according to the structure (XIX):

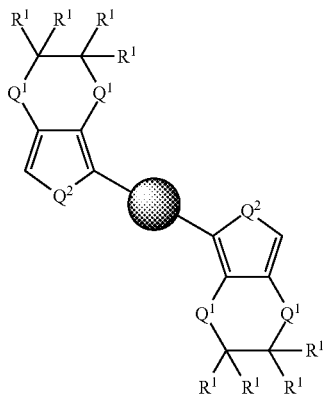

(XIX)

wherein each occurrence of $Q^1$ is independently S or O; each occurrence of $Q^2$ is independently S, O, or N—$R^2$ wherein $R^2$ is hydrogen or $C_1$-$C_6$ alkyl; each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and ⬤ represents an aryl.

Other exemplary electroactive monomers (or oligomers) include bis(3,4-ethylenedioxythienyl)arylenes according to structure (XIX) includes the compound wherein all $Q^1$ are O, both $Q^2$ are S, all $R^1$ are hydrogen, and ⬤ is phenyl linked at the 1 and 4 positions. Another exemplary compound is where all $Q^1$ are O, both $Q^2$ are S, all $R^1$ are hydrogen, and ⬤ is thiophene linked at the 2 and 5 positions (bisEDOT-thiophene).

Additional electroactive monomers (or oligomers) include the class of compounds according to structure (XX):

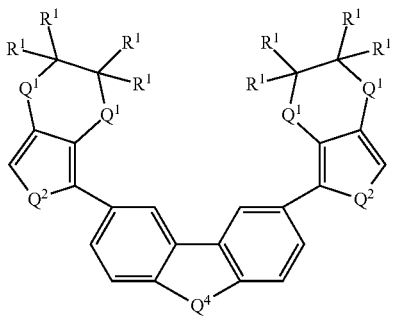

(XX)

wherein each occurrence of $Q^1$ is independently S or O; each occurrence of $Q^2$ is independently S, O, or N—$R^2$ wherein $R^2$ is hydrogen or $C_1$-$C_6$ alkyl; $Q^4$ is $C(R^1)_2$, S, O, or N—$R^2$; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, each occurrence of $Q^1$ is O; each occurrence of $Q^2$ is S; each occurrence of $R^1$ is hydrogen; and $R^2$ is methyl.

Still other electroactive monomers (or oligomers) include the class of compounds according to structure (XXI):

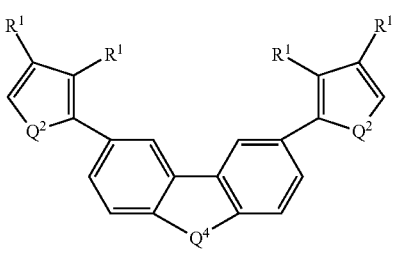

(XXI)

wherein each occurrence of $Q^2$ is independently S, O, or N—$R^2$ wherein $R^2$ is hydrogen or $C_1$-$C_6$ alkyl; $Q^4$ is $C(R^1)_2$, S, O, or N—$R^2$; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Additional electroactive monomers include the class of compounds according to structure (XXII):

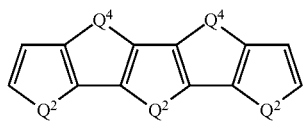

(XXII)

wherein each occurrence of $Q^2$ is independently S, O, or N—$R^2$ wherein $R^2$ is hydrogen or $C_1$-$C_6$ alkyl; each occurrence of $Q^4$ is $C(R^1)_2$, S, O, or N—$R^2$; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Other exemplary monomers (or oligomers) include the class of compounds according to structure (XXIII):

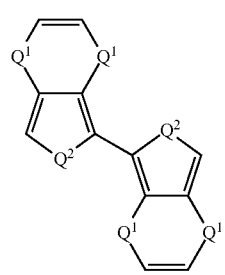

(XXIII)

wherein each occurrence of $Q^2$ is independently S, O, or N—$R^2$ wherein $R^2$ is hydrogen or $C_1$-$C_6$ alkyl; and each occurrence of $Q^1$ is independently S or O.

Exemplary electroactive monomers include the class of compounds according to structure (XXIV):

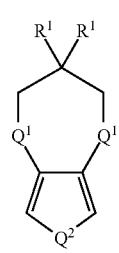

(XXIV)

wherein $Q^2$ is S, O, or N—$R^2$ wherein $R^2$ is hydrogen or $C_1$-$C_6$ alkyl; each occurrence of $Q^1$ is independently S or O; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, —$C_1$-$C_6$ alkyl-aryl, —$C_1$-$C_6$ alkyl-O-aryl, or —$C_1$-$C_6$ alkyl-O-aryl. In one embodiment, one $R^1$ is methyl and the other $R^1$ is benzyl, —$C_1$-$C_6$ alkyl-O-phenyl, —$C_1$-$C_6$ alkyl-O-biphenyl, or —$C_1$-$C_6$ alkyl-biphenyl.

Additional electroactive monomers (or oligomers) include the class of compounds according to structure (XXV):

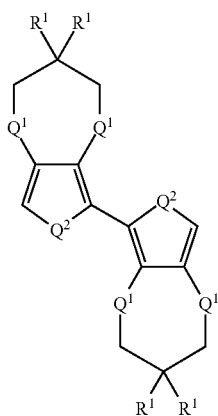

(XXV)

wherein each occurrence of $Q^2$ is independently S, O, or N—$R^2$ wherein $R^2$ is hydrogen or $C_1$-$C_6$ alkyl; each occurrence of $Q^1$ is independently S or O; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, one $R^1$ is methyl and the other $R^1$ is —$C_1$-$C_6$ alkyl-O-phenyl or —$C_1$-$C_6$ alkyl-O-biphenyl per geminal carbon center.

Other electroactive monomers (or oligomers) include the class of compounds according to structure (XXVI):

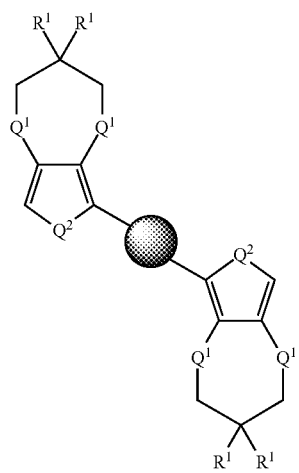

(XXVI)

wherein each occurrence of $Q^2$ is independently S, O, or N—$R^2$ wherein $R^2$ is hydrogen or $C_1$-$C_6$ alkyl; each occurrence of $Q^1$ is independently S or O; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and ◉ represents an aryl. In one embodiment, one $R^1$ is methyl and the other $R^1$ is —$C_1$-$C_6$ alkyl-O-phenyl or —$C_1$-$C_6$ alkyl-O-biphenyl per geminal carbon center.

Exemplary electroactive monomers include the class of compounds according to structure (XXVII):

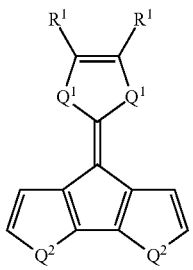

(XXVII)

wherein each occurrence of $Q^2$ is independently S, O, or N—$R^2$ wherein $R^2$ is hydrogen or $C_1$-$C_6$ alkyl; each occurrence of $Q^1$ is independently S or O; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Additional electroactive monomers include the class of compounds according to structure (XXVIII):

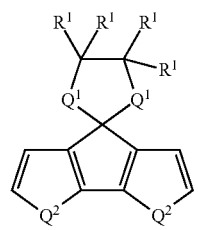

(XXVIII)

wherein each occurrence of $Q^2$ is independently S, O, or N—$R^2$ wherein $R^2$ is hydrogen or $C_1$-$C_6$ alkyl; each occurrence of $Q^1$ is independently S or O; and each occurrence of $R^1$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Another electroactive monomer includes aniline or substituted aniline according to structure (XXIX):

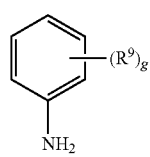

(XXIX)

wherein g is 0, 1, 2, or 3; and each occurrence of $R^9$ is independently $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, —$C_1$-$C_6$ alkyl-O-aryl, or N—$R^2$ wherein $R^2$ is hydrogen or $C_1$-$C_6$ alkyl.

Exemplary monomers include EDOT, PropOT, 1,4-bis[(3,4-ethylenedioxy)thien-2-yl)]-2,5-didodecyloxybenzene (BEDOT-B), benzothiadiazole (BTD), thieno[3,4-b]thiophene, thieno[3,4-b]furan, combinations thereof, and the like.

In one embodiment, a single type of electroactive monomer is employed to form a homopolymer. In another embodiment, a combination of two or more electroactive monomer types is used in a copolymerization process to form a conducting copolymer. As used herein "conducting polymer" is inclusive of conducting homopolymers and conducting copolymers unless otherwise indicated. Furthermore, in one embodiment, the polymerization may be conducted with a mixture of an electroactive monomer and a non-electroactive monomer. Color tuning can be achieved by the choice of monomers for copolymerization.

In another embodiment, a conducting oligomer, a viologen, a conducting polymer precursor, or a combination thereof, can be used in the place of, or in addition to, the electroactive monomer. It is to be understood that all embodiments that describe the use of monomers, there is the corresponding embodiment wherein the monomer component is replaced with a conducting oligomer, a viologen, a conducting polymer precursor, or a combination thereof.

As used herein, viologens include a 4,4'-dipyridinium salt according to structures (XXX) and (XXXI):

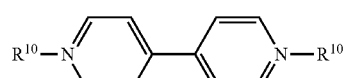

(XXX)

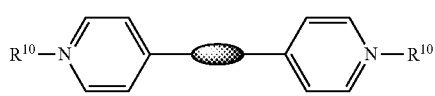

(XXXI)

wherein each occurrence of $R^{10}$ is independently $C_1$-$C_{12}$ alkyl, $C_1$-$C_{12}$ haloalkyl, aryl, —$C_1$-$C_6$ alkyl-O—$C_1$-$C_6$ alkyl, or —$C_1$-$C_6$ alkyl-O-aryl; and ⬭ is $C_2$, $C_4$, or $C_6$ alkenylene, an aryl or heteroaryl, specifically two, three, four, or more aryl or heteroaryl groups lined together. Exemplary ⬭ is phenylene, thiophene, and ethylene.

As used herein, a conducting polymer precursor includes a polymer or oligomer that can undergo further chain growth and/or crosslinking to produce the conjugated polymer.

Exemplary conducting polymer precursors include those of structures (XXXII) and (XXXIII):

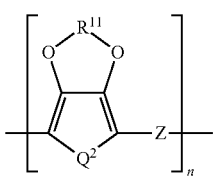

(XXXII)

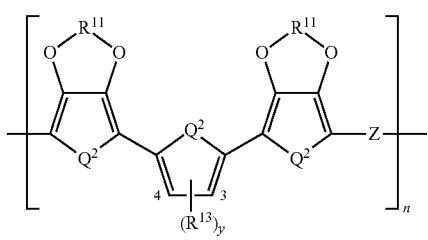

(XXXIII)

wherein n is an integer greater than 0; y is 0, 1, or 2; $Q^2$ is independently S, O, or N—$R^2$ wherein $R^2$ is hydrogen or $C_1$-$C_6$ alkyl; $R^{11}$ is a $C_1$-$C_{20}$ alkylene group; Z is a silylene group, for example —Si($R^{12}$)$_2$— or —Si($R^{12}$)$_2$—O—Si($R^{12}$)$_2$, wherein each $R^{12}$ independently is a $C_1$-$C_{20}$ alkyl; and $R^{13}$ is $C_1$-$C_{20}$ alkyl, $C_1$-$C_{20}$ alkoxy, $C_1$-$C_{20}$ thioalkyl, or $C_1$-$C_{20}$ aryl attached at the 3 and/or 4 position (shown) of the five-membered ring. $R^{12}$ can be, for example, methyl, ethyl, propyl, isopropyl, n-butyl, n-pentyl, n-hexyl, n-heptyl, or n-octyl. Exemplary $R^{13}$ include methyl, ethyl, propyl, isopropyl, n-butyl, n-pentyl, n-hexyl, n-heptyl, n-octyl, phenyl, n-butylthio, n-octylthio-, phenylthio-, and methoxyphenyl.

In one embodiment, n is an integer from 1 to 1000, y is 0, $R^{11}$ is ethylene (—$CH_2CH_2$—), each $Q^2$ is sulfur, Z is —Si($R^{12}$)$_2$—, and $R^{12}$ is n-octyl. This 2,5-bis[(3,4-ethylenedioxy)thien-2-yl]-thiophene (BEDOT-T) silylene precursor polymer can be formed by the nickel-catalyzed coupling of 3,4-ethylenedioxythiophene with dibromothiophene, to form BEDOT-T, followed by deprotonation of BEDOT-T using n-BuLi to form a dianion of BEDOT-T, and reacting the dianion with dichlorodioctylsilane to form the BEDOT-T silylene precursor polymer. The weight average molecular weight of the BEDOT-T silylene precursor polymer can be 1000 to 100,000 g/mole, more specifically 1,000 to 10,000 g/mole.

In another specific embodiment, n is an integer from 1 to 1000, y is 0, $R^{11}$ is 2,2-dimethylpropylene (—$CH_2C(CH_3)_2CH_2$—), each $Q^2$ is sulfur, Z is —Si($R^{12}$)$_2$—O—Si($R^{12}$)$_2$—, and $R^{12}$ is methyl. This PropOT-Me$_2$ silylene precursor polymer can be prepared by transesterification of 3,4-dimethoxythiophene with 2,2-dimethyl-1,3-propanediol using para-toluene sulfonic acid (PTSA) or dodecylbenzene sulfonic acid (DBSA) as catalysts in anhydrous toluene to form PropOT-Me$_2$, deprotonating the PropOT-Me$_2$ using 2 equivalents of n-BuLi to form the dilithium dianion, and reacting the dilithium dianion with dichlorotetramethylsiloxane to form the PropOT-Me$_2$ silylene precursor polymer. The weight average molecular weight of the PropOT-Me$_2$ silylene precursor polymer can be 1000 to 100,000 g/mole, more specifically 1,000 to 5000 g/mole.

In addition to the heterocyclic ring systems shown in the precursors of formulas (XXXII) and (XXXIII), other aromatic heterocycle groups, e.g., those of formulas (I)-(XXVIII), can also be synthesized with silylene of formula Z.

Other suitable conducting polymer precursors include polynorbornylene conducting polymer precursor having an electroactive group (e.g. an electroactive monomer or oligomer such as those described above) grafted onto the polymer backbone. Exemplary polynorbornylene conducting polymer precursors include those of structure (XXXIV):

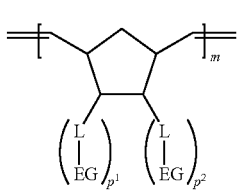

(XXXIV)

wherein L is a linking group containing 1-6 carbon atoms optionally interrupted by O, S, N($R^{14}$)$_2$, OC=O, C=OO, OC=OO, NR$^{14}$C=O, C=ONR$^{14}$, NR$^{14}$C=ONR$^{14}$, and the like, wherein $R^{14}$ is H, $C_1$-$C_{12}$ alkyl, $C_1$-$C_{12}$ haloalkyl, aryl, —$C_1$-$C_6$ alkyl-O—$C_1$-$C_6$ alkyl, or —$C_1$-$C_6$ alkyl-O-aryl; EG is an electroactive group; $p^1$ is 0 or 1; $p^2$ is 0 or 1 with the proviso that at least one of $p^1$ and $p^2$ is 1; and m is about 3 to about 3000.

The polynorbornylene can be prepared by polymerization of a norbornylene monomer such as structure (XXXV):

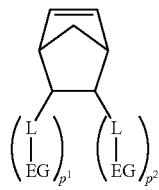

(XXXV)

wherein L, EG, $p^1$ and $p^2$ are as defined above. The polymerization to form the polynorbornylene can be accomplished via ring opening metathesis polymerization (ROMP) using an appropriate catalyst (e.g. Grubb's alkylidene catalyst).

Exemplary polynorbornylenes include those of structures (XXXVI) and (XXXVII):

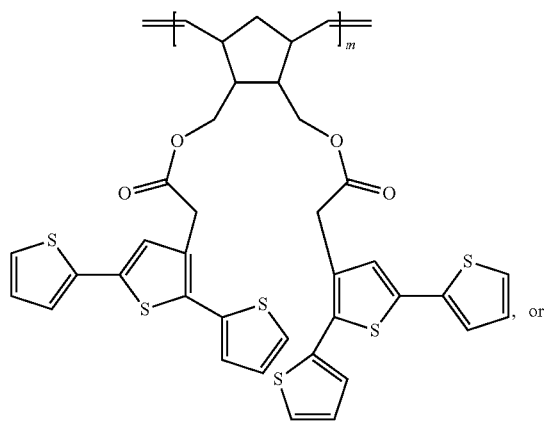

(XXXVI), or (XXXVII)

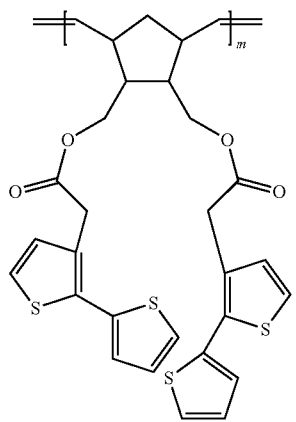

In another embodiment, the norbornylene monomer is used in combination with the electroactive monomer rather than the polynorbornylene conducting polymer precursor.

Additional electrochromic precursors are described, for example, in U.S. Pat. No. 7,321,012 to Sotzing, U.S. Patent Publs. 2007/0089845 to Sotzing et al., 2007/0008603 to Sotzing et al., and WO2007/008977 to Sotzing, the relevant disclosures of which are each incorporated by reference herein.

As used herein, electroactive oligomers include any dimer, trimer, or compound having multiple heterocycle units in length, wherein the heterocycle is an electroactive monomer. Exemplary oligomers have 2 to 10 units, specifically 2 to 7 units, and more specifically 2 to 3 units.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, "—CHO" is attached through carbon of the carbonyl group.

Unless otherwise indicated, the term "substituted" as used herein means replacement of one or more hydrogens with one or more substituents. Suitable substituents include, for example, hydroxyl, $C_6$-$C_{12}$ aryl, $C_3$-$C_{20}$ cycloalkyl, $C_1$-$C_{20}$ alkyl, halogen, $C_1$-$C_{20}$ alkoxy, $C_1$-$C_{20}$ alkylthio, $C_1$-$C_{20}$ haloalkyl, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, amido, or carbamoyl.

As used herein, "alkyl" includes straight chain, branched, and cyclic saturated aliphatic hydrocarbon groups, having the specified number of carbon atoms, generally from 1 to about 20 carbon atoms, greater than 3 for the cyclic. Alkyl groups described herein typically have from 1 to about 20, specifically 3 to about 18, and more specifically about 6 to about 12 carbons atoms. Examples of alkyl include, but are not limited to, methyl, ethyl, n-propyl, isopropyl, n-butyl, 3-methylbutyl, t-butyl, n-pentyl, and sec-pentyl. As used herein, "cycloalkyl" indicates a monocyclic or multicyclic saturated or unsaturated hydrocarbon ring group, having the specified number of carbon atoms, usually from 3 to about 10 ring carbon atoms. Monocyclic cycloalkyl groups typically have from 3 to about 8 carbon ring atoms or from 3 to about 7 carbon ring atoms. Multicyclic cycloalkyl groups may have 2 or 3 fused cycloalkyl rings or contain bridged or caged cycloalkyl groups. Examples of cycloalkyl groups include cyclopropyl, cyclobutyl, cyclopentyl, or cyclohexyl as well as bridged or caged saturated ring groups such as norbornane or adamantane.

As used herein "haloalkyl" indicates both branched and straight-chain alkyl groups having the specified number of carbon atoms, substituted with 1 or more halogen atoms, generally up to the maximum allowable number of halogen atoms ("perhalogenated"). Examples of haloalkyl include, but are not limited to, trifluoromethyl, difluoromethyl, 2-fluoroethyl, and penta-fluoroethyl.

As used herein, "alkoxy" includes an alkyl group as defined above with the indicated number of carbon atoms attached through an oxygen bridge (—O—). Examples of alkoxy include, but are not limited to, methoxy, ethoxy, n-propoxy, i-propoxy, n-butoxy, 2-butoxy, t-butoxy, n-pentoxy, 2-pentoxy, 3-pentoxy, isopentoxy, neopentoxy, n-hexoxy, 2-hexoxy, 3-hexoxy, and 3-methylpentoxy.

"Haloalkoxy" indicates a haloalkyl group as defined above attached through an oxygen bridge.

As used herein, the term "aryl" indicates aromatic groups containing only carbon in the aromatic ring or rings. Such aromatic groups may be further substituted with carbon or non-carbon atoms or groups. Typical aryl groups contain 1 or 2 separate, fused, or pendant rings and from 6 to about 12 ring atoms, without heteroatoms as ring members. Where indicated aryl groups may be substituted. Such substitution may include fusion to a 5 to 7-membered saturated cyclic group that optionally contains 1 or 2 heteroatoms independently chosen from N, O, and S, to form, for example, a 3,4-methylenedioxy-phenyl group. Aryl groups include, for example, phenyl, naphthyl, including 1-naphthyl and 2-naphthyl, and bi-phenyl.

As used herein "heteroaryl" indicates aromatic groups containing carbon and one or more heteroatoms chosen from N, O, and S. Exemplary heteroaryls include oxazole, pyridine, pyrazole, thiophene, furan, isoquinoline, and the like. The heteroaryl groups may be substituted with one or more substituents.

As used herein, "halo" or "halogen" refers to fluoro, chloro, bromo, or iodo.

As used herein, "arylene" includes any divalent aromatic hydrocarbon or two or more aromatic hydrocarbons linked by a bond, a heteroatom (e.g., O, S, S(=O), S(=O)$_2$, etc.), a carbonyl group, an optionally substituted carbon chain, a carbon chain interrupted by a heteroatom, and the like.

The electrolyte/electroactive monomer mixture may optionally include an additional additive. The additive may be chosen so that it does not, unless desired, interfere with oxidative polymerization, interfere with color/contrast/switching, interfere with electrodes or other components in a degradative way. Exemplary additional additives may also be used in the combination of electrolyte and electroactive monomer, and include conductive fillers such as particulate copper, silver, nickel, aluminum, carbon black, graphene, carbon nanotubes, buckminister fullerene, and the like; non-conductive fillers such as talc, mica, wollastonite, silica, clay, dyes, pigments (zeolites), and the like.

The solid-state devices may further include a variety of substrate materials (flexible or rigid) used to house the electrolyte/monomer combination. Exemplary substrate materials include glass, plastic, silicon, a mineral, a semiconducting material, a ceramic, a metal, and the like, as well as a combination thereof. The substrate may be inherently conductive. Flexible substrate layers can be made from plastic. Exemplary plastics include polyethylene terephthalate (PET), poly (arylene ether), polyamide, polyether amide, etc. The substrate may include mirrored or reflective substrate material. A further advantage of the process is that the substrates do not require cleaning as compared to ITO substrates which need to be vigorously cleaned prior to immersion in an electrolyte bath otherwise any defect will cause unevenness of the film deposited.

Exemplary electrode materials for use in the electrochromic devices can include inorganic materials such as glass-indium doped tin oxide (glass-ITO), doped silicon, metals such as gold, platinum, aluminum, and the like, metal alloys such as stainless steel ("SS"), SS 316, SS316L, nickel and/or cobalt alloys such as Hastelloy-B® (Ni62/Mo28/Fe5/Cr/Mn/Si), Hastelloy-C®, and the like; and organic materials such as a conjugated polymer such as poly(3,4-ethylenedioxythiophene)-polystyrene sulfonate (PEDOT-PSS), conjugated polymers prepared from an electroactive monomer described herein, carbon black, carbon nanotubes, graphene, and the like.

In one embodiment, all of the electrodes are polyethylene terephthalate (PET)/indium-doped tin oxide (ITO) substrates.

The solid-state device can generally be fabricated by encasing a layer of the combination of electrolyte composition and electroactive monomer between at least two electrodes, wherein the electrodes are in electrical communication with the layer of the combination. In an exemplary generalized assembled solid-state device as shown in FIG. 1, a layer of a combination of electrolyte composition (exemplified here with a gel electrolyte precursor) and electroactive monomer (10) is disposed between a first electrode (20) and a second electrode (30) and further (10) is in electrical communication with (20) and (30). Further, substrate layers (40) and (50) encase (10), (20), and (30). Upon application of a voltage, the solid-state device of FIG. 1 includes a layer of a matrix containing electrolyte composition and conjugated polymer (5) disposed between a first electrode (20) and a portion of electrolyte composition (here a gel electrolyte formed by crosslinking the gel electrolyte precursor either before or after the application of voltage) (15); the first electrode (20) and second electrode (30) area in electrical communication with (15) and (5). Further, substrate layers (40) and (50) encase (5), (15), (20), and (30).

The combination of electrolyte composition and electroactive monomer can be formed into a layer in the device by mixing the components to form a dispersion or solution, and applying the mixture to a substrate via conventional processes including ink jet printing, screen printing, roll to roll printing processes, reel to reel processing, spin coating, meniscus and dip coating, spray coating, brush coating, doctor blade application, curtain casting, drop casting, and the like.

In one embodiment, a device is assembled comprising a combination of a gel electrolyte precursor and an electroactive monomer disposed between a first electrode and a second electrode.

In another embodiment, a device is assembled by disposing a combination of a gel electrolyte precursor and a electroactive monomer on a first electrode, crosslinking the gel electrolyte precursor to form a layer of crosslinked gel electrolyte and electroactive monomer, then adding a second layer of gel electrolyte precursor, optionally in combination with a electroactive monomer, on top of the layer of crosslinked gel electrolyte and electroactive monomer, and assembling a second electrode on the second layer to form a sealed, assembled device. Within this embodiment, the electroactive monomers can be polymerized before or after the crosslinking of the gel electrolyte precursor in the second layer. Such a device may form a dual-conjugated polymer device. Alternatively, monomers with different oxidation potentials may be exploited such that one material polymerizes on one electrode and the second is polymerized on the other electrode, each in situ.

The polymerization of the electroactive monomers (and optional conducting oligomer, viologen, conducting polymer precursor, or a combination thereof) can be effected by cyclic voltammetry (triangle wave voltammetry), chronocoulometry/constant voltage, galvanostatic/constant current, or square-wave voltammetry (pulsed). In several embodiments, a reference electrode is fabricated inside the device. The potential (voltage) is applied to one electrode of the device for a sufficient time to substantially deplete the monomer from the combination of electrolyte composition and electroactive monomer. The formation of the conjugated polymer occurs on one electrode side, via diffusion through the electrolyte composition. In one embodiment, the conjugated polymer is not a discrete, thin film layer, as can be formed using electrodeposition methods, but rather is a blend or composite within the electrolyte composition.

In several embodiments, the device comprises an internal reference electrode system to result in a three-electrode cell. In one embodiment, the internal reference electrode is a silver wire pseudo-reference electrode embedded within the device to control voltage and prevent electrode damage (e.g., ITO degradation due to over-oxidation).

In another embodiment, a sealing means (e.g. a gasket) is provided between two substrates or electrodes to form an electrochormic device wherein an internal reference electrode is provided between the sealing means. The sealing means seals the device.

In one embodiment, by controlling the voltage, it may be possible to achieve layered color mixing of various monomers, to form dual-polymer devices with different polymer composites being formed on alternate electrodes, and to form complex gradient blends and copolymers. Varying the voltage, time of application, and/or method of polymerization, one may achieve these architectures.

In yet another embodiment, a method comprises polymerizing a first electroactive monomer on a first electrode using a first potential and then polymerizing a second electroactive monomer at a second electrode at a second potential different than the first potential. Such a process may create a dual-conjugated polymer device. Monomers with different oxidation potentials may be exploited such that one material polymerizes on one electrode at one applied voltage and the second is polymerized on the other electrode at another applied voltage, each in situ.

The devices can be sealed to prevent water, air, or other contaminant materials from entering the device, as well as to prevent loss of electrolyte composition/electroactive monomer or electrolyte composition/conjugated polymer. Sealing can be accomplished using an adhesive such as a polyurethane based UV curable resin or other suitable adhesive used in the formation of electrochromic devices.

The devices can be patterned using a variety of techniques including using a blocking (aka "insulating") layer of material (e.g. blocking material applied by ink jet printing, spray-cast, etc.), drop-cast patterning, directed polymerization by the selective application of voltage, direct patterning, lithography, patterned electrode surfaces, and other related methods to result in the formation of complex electrochromic devices. High-resolution images can be created using the patterning. The entire region of the device can be patterned or alternatively, only a portion of the device. In one embodiment, the pattern generated may be in the form of a straight line, a curved line, a dot, a plane, or any other desirable geometrical shape. The pattern may be one dimensional, two dimensional or three dimensional if desired and may be formed upon the surface of the combination of electrolyte composition and conjugated polymer mixture as an embossed structure or embedded within (below) the surface of the combination.

The devices can be patterned using a blocking layer of material, such as a material that is insoluble in the electrolyte composition. Exemplary blocking materials include polystyrene, etc. The blocking material can be applied to the working electrode using spray-casting, drop-casting, ink jet, screen printing, roll to roll printing processes, reel to reel processing, spin coating, meniscus and dip coating, brush coating, doctor blade application, curtain casting, and the like. This layer now blocks the electrical field produced within the device upon application of voltage, which results in no polymer forming in these areas. The device, when in situ polymerized, will then be patterned around the blocking layer. When the device is switched, the blocking layer will remain constant as the electrochromic changes color around it. The blocking layer may be loaded with a dye, such that in one state, the electrochromic is the same color as the blocking layer but in another state it is not, thus allowing for the patterned image/lettering/numbering/etc to be reversibly "revealed" and "concealed" upon switching.

In the patterning process using selective application of voltage, an electrochemical atomic force microscope (AFM) tip can be used as an external counter electrode to supply the voltage. In an alternative embodiment, injection polymerization can be accomplished using a needle to supply both a voltage and the combination of an electroactive monomer and electrolyte composition.

In one embodiment, a nanolithographic pattern may be generated by utilizing electrochemical atomic force microscopy (AFM) to selectively polymerize the electroactive monomer. In this method, an AFM tip (coated with a conductor such as gold, platinum/iridium, carbon, optionally modified with carbon nanotubes) is used as a counter electrode. The AFM tip is either brought into contact with the combination of electrolyte composition and electroactive monomer or brought into the proximity of the combination of electrolyte composition and electroactive monomer without touching the combination, and a suitable voltage is applied between the electrochemical AFM tip and the substrate, which promotes polymerization of the electroactive monomer contacted by (or brought in close proximity to) the AFM tip.

In one embodiment, the device can be prepared with individually addressable electrode systems, thus allowing for pixilation of a device. Such devices are useful for simple display applications.

The electrochromic devices are capable of displaying a still or animated color image composed of a combination of red, green, and blue visible light. Displaying occurs typically by reflection or transmission of visible light rather than by emission when the electrochromic material is subjected to an electrical potential.

In one embodiment, the device is a reflective-type device (e.g., [Mirrored] aluminum or steel background/PET-ITO counter).

Typically, when each electrode comprises the same electrochromic material, the electrodes display different colors simultaneously, due to the electrochromic material undergoing oxidation at the cathode and reduction at the anode, a so-called "dual electrochromic" design.

The process disclosed herein can be used to prepare solid-state devices such as electrochromic devices, organic thin-film transistors, organic light-emitting diodes, organic photovoltaic cells, and the like. Specific articles prepared from the devices include color-changing sunglasses, high-contrast sunglasses or goggles, windows devised for heat-modulation in skyscrapers/buildings or fashion-tinting, auto-dimming mirrors in automobiles and trucks, displays, or a variety of other color-changing devices.

In one embodiment, the solid-state device comprises a single composite layer of the conjugated polymer and electrolyte composition.

In another embodiment, the solid-state device comprises a dual-type configuration wherein there is a second composite layer of conjugated polymer on the counter electrode. The second layer can be a composite of a second conjugated polymer and second electrolyte composition. The use of two conjugated polymer layers allows for mixed colored states or enhanced contrast by using conjugated polymers with complementary optical characteristics. Within this embodiment, an electroactive monomer which produces an anodically coloring polymer and an electroactive monomer which produces a cathodically coloring polymer can be used in the dual-type configuration. Exemplary dual-type configurations are disclosed in U.S. Patent Publ. 2007/0008603 to Sotzing et al.

The following illustrative examples are provided to further describe the invention and are not intended to limit the scope of the claimed invention.

EXAMPLES

Example 1

In Situ Polymerization of EDOT in an Assembled Solid-State Device

A device was assembled using a glass/indium-doped tin oxide (ITO) substrate, a polyethylene terephthalate (PET)/

ITO substrate, and an electrolyte composition containing 1 gram lithium trifluoromethanesulfonate (LITRIF) salt, 5 grams of polyethylene glycol diacrylate (PEG-DA; Mn=700) as the gel electrolyte precursor, 5 grams of propylene carbonate (PC) plasticizer, and 17.5 milligrams of 2,2;-dimethoxyphenylacetophenone (DMPAP) UV-activated cross-linking agent. To the electrolyte composition was mixed 250 milligrams of 3,4-ethylenedioxythiophene (EDOT) as the electroactive monomer. PEG-DA is crosslinked using UV light 365 nm, 5.8 mW/cm$^2$ for about 15 minutes.

The device has been shown to switch optically at the same rate as devices prepared with PEDOT films prepared by electrodeposition. Over the course of 50 cycles, no perceived losses had occurred. The CIE Lu'v' color coordinates for the device containing in situ polymerized EDOT were u'=0.19, v'=0.42 for the neutral state and u'=0.21, v'=0.48 for the oxidized state, different from other PEDOT films in that the oxidized state is much more transparent (closer to the white point on the CIE diagram). Traditionally prepared films of PEDOT show a light-blue oxidized state.

Figure 2:
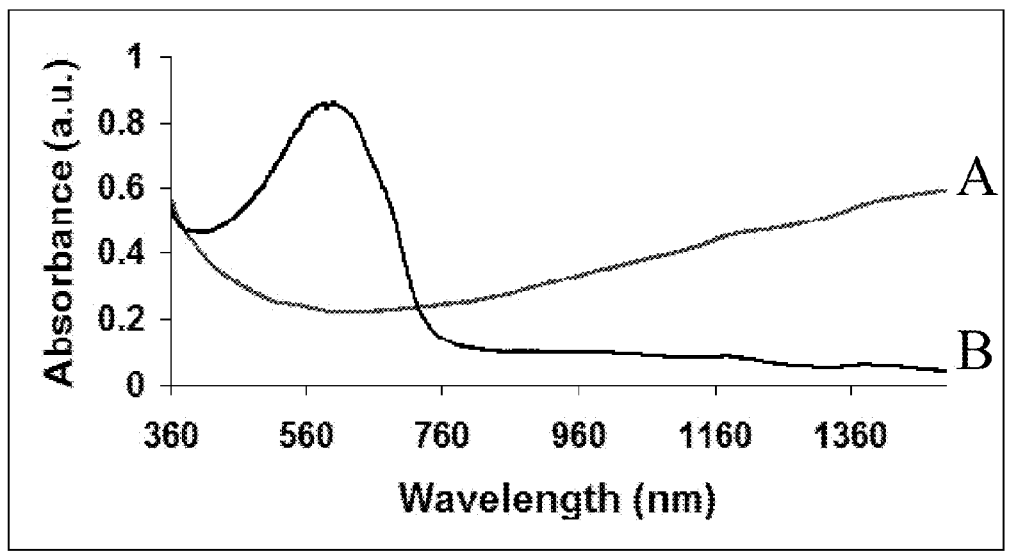
FIG. 2 illustrates the UV-Vis-NIR spectrum for a device containing in situ formed PEDOT: oxidized state (A) and neutral state (B) (Photopic contrast: 40%).

Spectroelectrochemistry of the device yielded a Photopic contrast of 40%, similar to those achieved for traditionally prepared PEDOT devices. It should be noted that the film thickness of the device in this Example has not been optimized, thus the Photopic contrast of an optimized film thickness is expected to be higher. FIG. 2 shows the UV-Vis-NIR spectrum for the device in its oxidized (A) and neutral states (B). There is a less-notable tail from the IR into the Visible region with this system, showing a much less blue oxidized state than traditional PEDOT films prepared via electrodeposition.

Example 2

In Situ Polymerization of EDOT in an Assembled Solid-State Device Using an Ionic Liquid A solid-state device similar to Example 1 was prepared using ionic liquid 1-butyl-3-methylimidazolium hexafluorophosphate (BMIMPF$_6$) in the electrolyte composition with no plasticizer component.

Example 3

Exploration of the In Situ Polymerization of EDOT in an Assembled Solid-State Device Before and after Crosslinking of the Gel Electrolyte Precursor Two solid-state devices similar to Example 1 were prepared using no plasticizer. In the first device, the gel electrolyte precursor is crosslinked prior to the in situ polymerization of EDOT. In the second device, a voltage is applied to polymerize EDOT prior to the crosslinking of the gel electrolyte precursor. The second device exhibited a better switching speed (2-5 seconds) and a lower conversion time (30 seconds), while the first device took up to 5 minutes to make a film of PEDOT and exhibits over 25 seconds to switch. It has been shown that the conjugated polymer can be prepared prior to or post crosslinking of the gel electrolyte precursor allowing for more flexible device assembly processes.

Example 4

Figure 3:
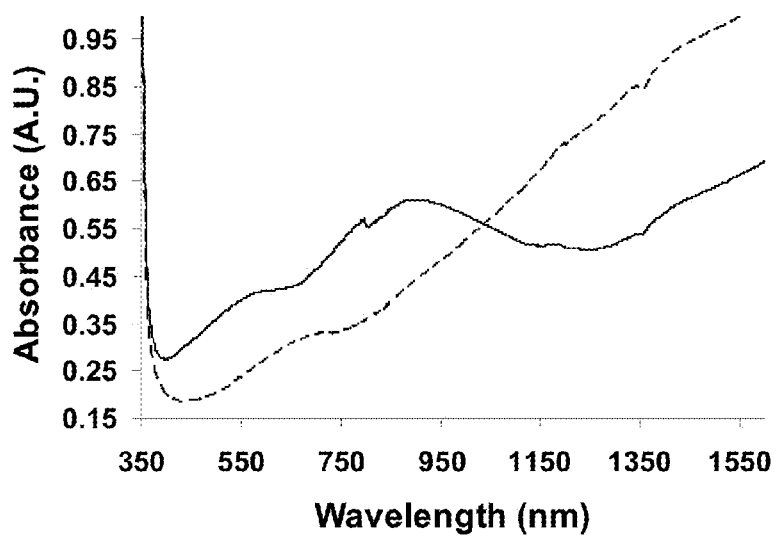
FIG. 3 illustrates the spectroelectrochemistry for a poly (BTD-co-EDOT) device, Solid line=neutral state (0 V); dashed line=oxidized state (3 V).

In Situ Copolymerization of EDOT (Liquid) and BTD (Solid) in an Assembled Solid-State Device A solid-state device similar to Example 1 was prepared by co-mixing a solid electroactive monomer benzothiadiazole (BTD), and a liquid electroactive monomer EDOT into with the electrolyte composition. The two electroactive monomers are then co-polymerized in situ. FIG. 3 illustrates the spectroelectrochemistry for the BTD-EDOT device, showing the suitability of copolymerization processes, as well as the use of solid and liquid electroactive monomers (BTD is a solid and EDOT is a liquid at room temperature). The solid line=neutral state (0 V) and the dashed line=oxidized state (3 V).

Example 5

In Situ Copolymerization of an Electroactive Monomer in an Assembled Reflective-Type Device A reflective-type device was prepared with a steel substrate, a PET/ITO substrate (3"×3" or 7.62 centimeter×7.62 centimeter) and a mixture of an electrolyte composition and an electroactive monomer. The resulting device after polymerization of the electroactive monomer exhibited no iris effect.

Example 6

Figure 4:
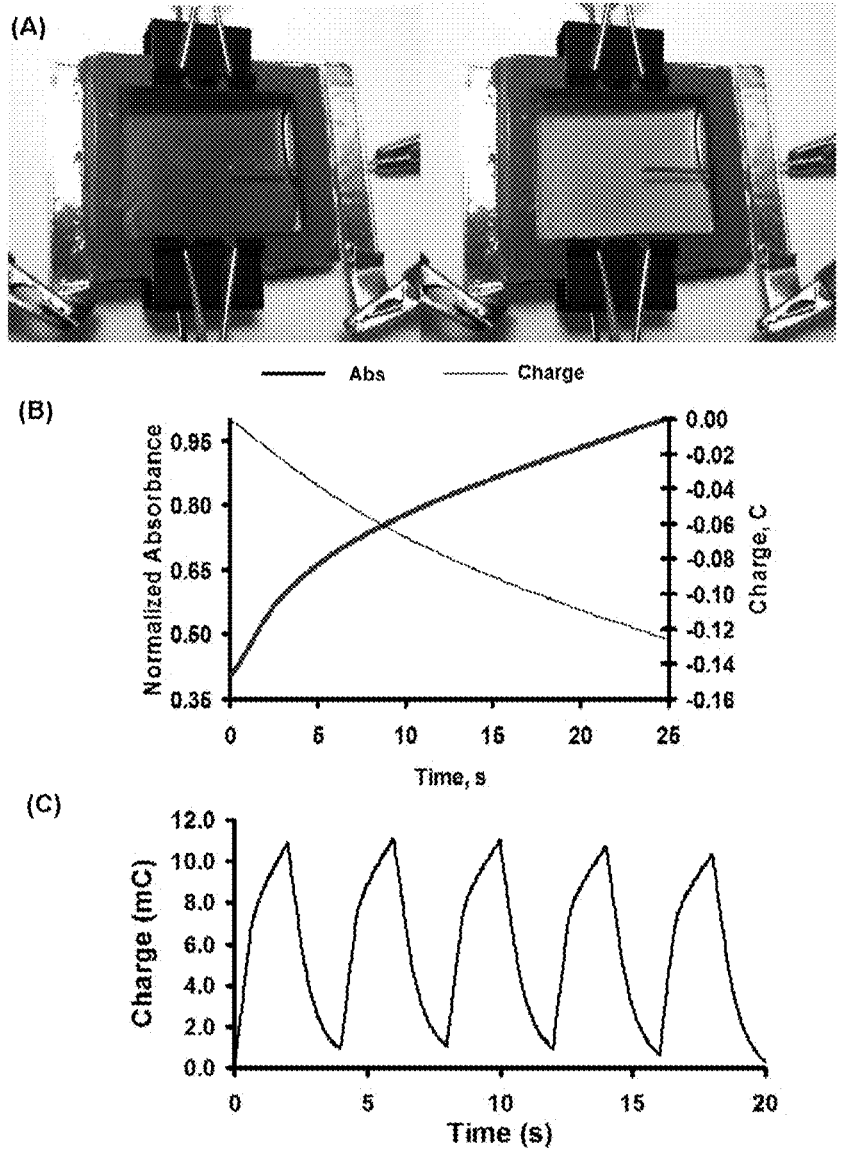
FIG. 4(A) illustrates an in situ PEDOT device with Ag wire as reference electrode.
FIG. 4(B) illustrates absorbance at 1500 nm during the conversion process and charges consumed for an in situ PEDOT device with Ag wire as reference electrode.
FIG. 4(C) illustrates the chronocoulometry of an in situ PEDOT device with Ag wire as reference electrode switching after conversion.

Use of a Reference Electrode in the In Situ Polymerization of EDOT in an Assembled Solid-State Device To investigate the potential actually applied on the working electrode, a device was assembled with a silver wire (reference electrode) incorporated inside the device (FIG. 4(A)). The electrolyte composition was prepared by combining 5 g of propylene carbonate, 5 g of poly(ethylene glycol) diacrylate (Mn=700), 1 g of trifluoromethanesulfonate, 17.5 mg of DMPAP together and sonicating for 15 min. EDOT was added to the electrolyte to make a 2.5 wt % solution that was drop-cast onto an ITO substrate. A second ITO substrate was put on top of the first with a rubber gasket glued between the two substrates. A silver (Ag) wire was placed between the rubber gasket and partially immersed inside the electrolyte composition. The assembled device was then UV crosslinked at 365 nm. The Ag reference electrode was calibrated to 0.225V vs. normal hydrogen electrode (NHE).

The crosslinked device was then applied a potential of 3V for 30 s and switched between the voltage of 0-3V after polymerization. Electrochemistry was carried out using CHI 400 and 660 A potentiostats. Optical characterizations were carried out with a Varian Cary 5000 UV-Vis-NIR spectrophotometer. The monomer was polymerized inside the assembled device under a +3V potential from the potentiostat with reference electrode shorted with the counter electrode. A +1.1V bias with respect to Ag was found. The device was then switched between oxidized and neutral states between +3V and 0V from the potentiostat. The 0V was used to avoid polymerization on the counter electrode. The absorption at 1500 nm was monitored to indicate the degree of conversion as it is characteristic for the PEDOT. The kinetic spectrum and charge consumed are shown in FIG. 4(B); the increase in absorbance tapered within 30 s, meaning that majority of the polymer was formed during this period, which matches the coulombic data. FIG. 4(C) illustrates the chronocoulometry of the device switching after conversion.

Devices with 0.2 wt % and 1 wt % EDOT loading were also assembled. Note the 0.2 wt % EDOT is approximately the monomer concentration (0.1 M) in a traditional electrodeposition bath. Each concentration used showed similar trends. Although conversion time increased with higher monomer loading, switching time remained constant as it is a diffusion process. All conversions resulted in continuous, blue-colored devices; higher EDOT loading led to darker blues. Different methods, such as cyclic voltammetry, square wave, and bulk electrolysis were also used to convert the monomer in situ and led to similar devices.

Example 7

Exploration of Electrolyte Plasticizer Content on the In Situ Polymerization of EDOT in an Assembled Solid-State Device Devices with different loading of propylene carbonate (PC) plasticizer were fabricated to investigate the effect of plasticizer concentration on diffusion. Electrolyte compositions with 0, 10%, 25% and 50% of PC were used. Ionic liquid 1-butyl-3-methylimidazolium hexafluorophosphate (BMIMPF$_6$) was employed to replace the plasticizer and salt in the electrolyte. Table 1 shows the time needed for conversion in situ and switching speed of the devices as a function of different PC weight percentages in the electrolyte composition and monomer loadings.

TABLE 1

| PC wt % | Varying Electrolyte Composition | | | |
|---|---|---|---|---|
|  | 0 | 10 | 25 | 50 |
| Conversion Time, s | 52.88 | 34.55 | 24.00 | 12.91 |
| Switching Time, s | 0.045 | 0.045 | 0.045 | 0.045 |

| | Varying wt % EDOT | | | |
|---|---|---|---|---|
|  | 0.1 | 0.2 | 1.0 | 2.5 |
| Conversion Time, s | 11.26 | 11.65 | 12.73 | 12.91 |
| Switching Time, s | 0.045 | 0.045 | 0.045 | 0.045 |

As shown in Table 1, the conversion time increased with lower plasticizer concentration while switching speed remained the same. Both conversion time and switching time were significantly longer as compared to the normal gel electrolyte due to the high viscosity of the ionic liquid and slower diffusion rate.

Example 8

Determination of Conversion Yield

To assess the actual conversion yield inside the in situ device, the converted device was disassembled and the polymer-containing electrolyte was soxhleted and the concentration of the EDOT was measured by UV-vis. Multiple headspace extraction GC-MS (MHE GC-MS), a technique that can exhaustively extract residual monomers from solid matrix, was also employed as a parallel approach. Both methods showed undetectable change of the monomer amount between the control group (0 s conversion) and the sample group (30 s conversion). According to the most commonly accepted Diaz's mechanism of the polymerization of conducting polymers, the ratio between the number of electrons and the monomers reacted is 2 to 1. Therefore, with the total charge consumed during the polymerization, assuming no side reactions and overoxidation, the amount of monomers that were involved in the polymerization can be calculated. Assuming the density of PEDOT to be 1 g/cm$^3$, for a device with initial EDOT loading of ca. 18 mg, active area of 3.5 cm×4 cm, the conversion yield was calculated to be ca. 0.5%, and the film thickness was estimated to be 65 nm. Based on previous studies, there is a relation between the photopic contrast and PEDOT film thickness. Based on these studies, the in situ device possesses the photopic contrast of a ca. 75 nm thick film, which confirmed an early observation of the in situ device having higher contrast compared to its ex situ counterparts. It is worth noting that although the yield value appears to be low, it is still comparable, if not better, to the traditional method. A 20 mL 10 mM EDOT solution bath would have a 0.49% conversion yield to obtain a 100 nm thick, 3.4 cm×4 cm film, as well as a large amount of solvent and salt that have to be discarded after one use. Furthermore, the monomer left in the in situ device does not affect the stability of the device compared to their ex situ counterparts after the initial break-in period.

Example 9

Patterned Devices, Inkjet Printing

Figure 5:
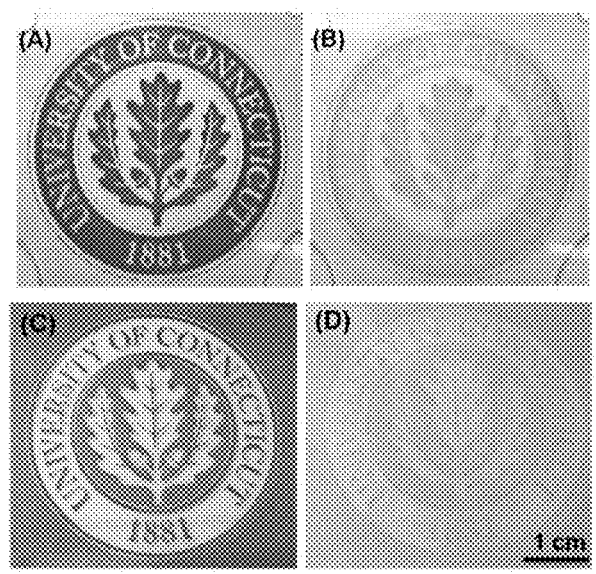
FIG. 5(A)-(D) illustrate images of inkjet patterned in situ electrochromic devices.

A polystyrene University of Connecticut logo pattern was inkjet printed by a Dimatix DMP 2800 materials printer using polystyrene ink. The polystyrene ink was prepared by dissolving polystyrene pellets in toluene to form a 2 wt % solution. The pattern was jetted onto ITO substrates. Devices were assembled and converted as described before using the inkjet patterned ITO substrates containing the polystytene blocking layer. FIG. 5 shows images of positive (top) and negative (bottom) logo patterned in situ PEDOT device (top, (A) and (B)) and poly(2,2-dimethyl-3,4-propylenedioxythiophene) (PPropOT-Me2 (bottom, (C) and (D)) in neutral A), C) and oxidized B), D) states, respectively.

The patterned devices can be formed without the need for rigorous cleaning of substrates as is required using electrodeposition. Additionally, blockage of the substrate makes complex patterning possible and facile. The high resolution of the inkjet technique allows for the fabrication of complex patterns and preserves all the details of the image. Different monomers can be used in the in situ process, thus making the process exceedingly versatile. Different thiophenes and pyrroles were tested with this approach, which resulted in devices of purple, red, blue, yellow, green, and brown colors. Monomers tested include 2,2-dimethyl-3,4-propylenedioxythiophene (PropOT-Me2); bis(3,4-ethylenedioxythienyl) thiophene (BEDOT-T); 1,3-diisopropyl-3,4-propylenedioxythiophene; pyrrole; and N-methyl pyrrole in different colored states.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising", "having", "including", and "containing" are to be construed as open-ended terms (i.e., meaning "including, but not limited to") unless otherwise noted. "Or" means and/ or. Recitation of ranges of values herein are merely intended to serve as a shorthand method of referring individually to each separate value falling within the range, unless otherwise indicated herein, and each separate value is incorporated into the specification as if it were individually recited herein. All ranges disclosed herein are inclusive and combinable. The modifier "about" used in connection with a quantity is inclusive of the stated value and has the meaning dictated by the context (e.g., includes the degree of error associated with measurement of the particular quantity).

The essential characteristics of the present invention are described completely in the foregoing disclosure. One skilled in the art can understand the invention and make various modifications without departing from the basic spirit of the invention, and without deviating from the scope and equivalents of the claims, which follow. Moreover, any combination of the above-described elements in all possible variations thereof is encompassed by the invention unless otherwise indicated herein or otherwise clearly contradicted by context.

What is claimed is:

1. A solid-state device, comprising:
   at least two electrodes; and
   a composite disposed between the at least two electrodes, the composite comprising a conjugated polymer and a crosslinked gel electrolyte composition;
   wherein the composite is formed by in situ polymerization of an electro active monomer in a combination comprising the crosslinked gel electrolyte composition and an electroactive monomer, wherein the conjugated polymer is not formed as a discrete film.

2. The device of claim 1, wherein the crosslinked gel electrolyte composition comprises a lithium, sodium, or potassium salt, or an ionic liquid.

3. The device of claim 1, further comprising a layer disposed on the composite, the layer comprising
   a second electrolyte composition, or
   a second composite comprising the second electrolyte composition and a second conjugated polymer formed by in situ polymerization of a second electroactive monomer in a second combination comprising the second electrolyte composition and second electroactive monomer.

4. The device of claim 1, wherein the electroactive monomer is thiophene, substituted thiophene, carbazole, 3,4-ethylenedioxythiophene, thieno[3,4-b]thiophene, substituted thieno[3,4-b]thiophene, dithieno[3,4-b:3',4'-d]thiophene, thieno[3,4-b]furan, substituted thieno[3,4-b]furan, bithiophene, substituted bithiophene, pyrrole, substituted pyrrole, acetylene, phenylene, substituted phenylene, naphthalene, substituted naphthalene, biphenyl and terphenyl and their substituted versions, phenylene vinylene (e.g., p-phenylene vinylene), substituted phenylene vinylene, aniline, substituted aniline, indole, substituted indole, or a combination thereof.

5. The device of claim 1, wherein the electro active monomer is

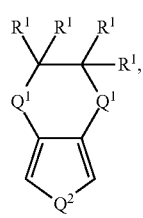

(I)

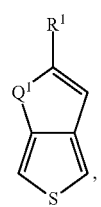

(II)

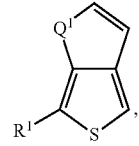

(III)

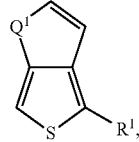

(IV)

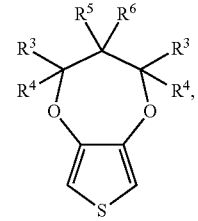

(V)

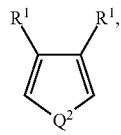

(VI)

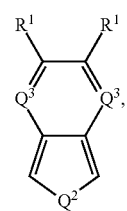

(VII)

(VIII)

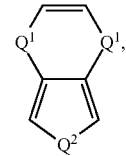

(IX)

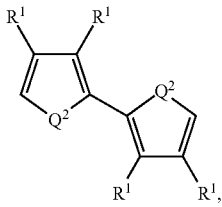

(X)

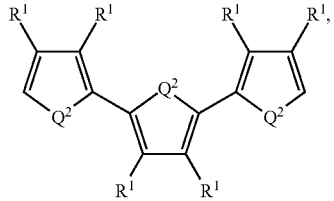

(XI)

-continued
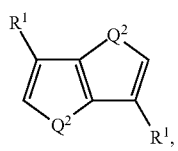
(XII)
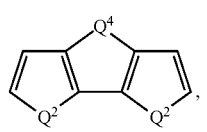
(XIII)
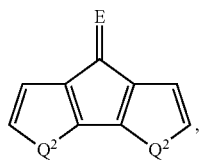
(XIV)
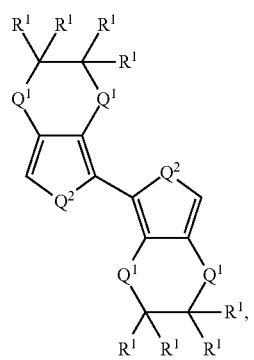
(XV)
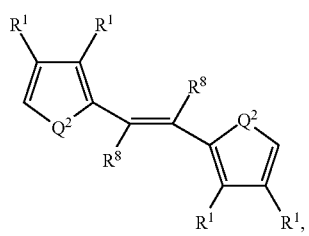
(XVI)
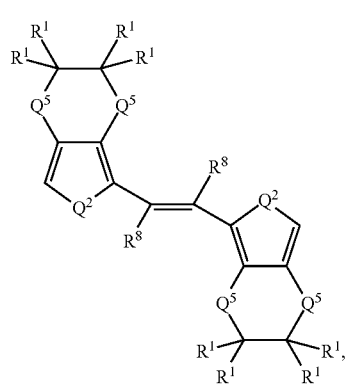
(XVII)
-continued
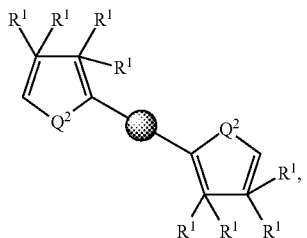
(XVIII)
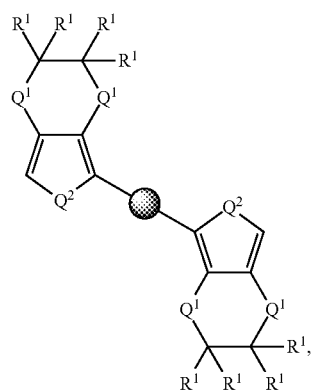
(XIX)
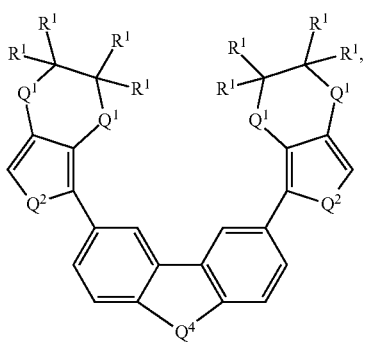
(XX)
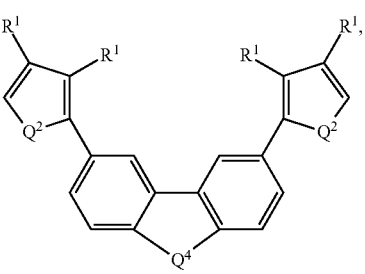
(XXI)
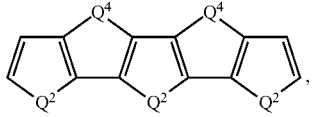
(XXII)
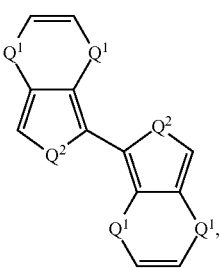
(XXIII)

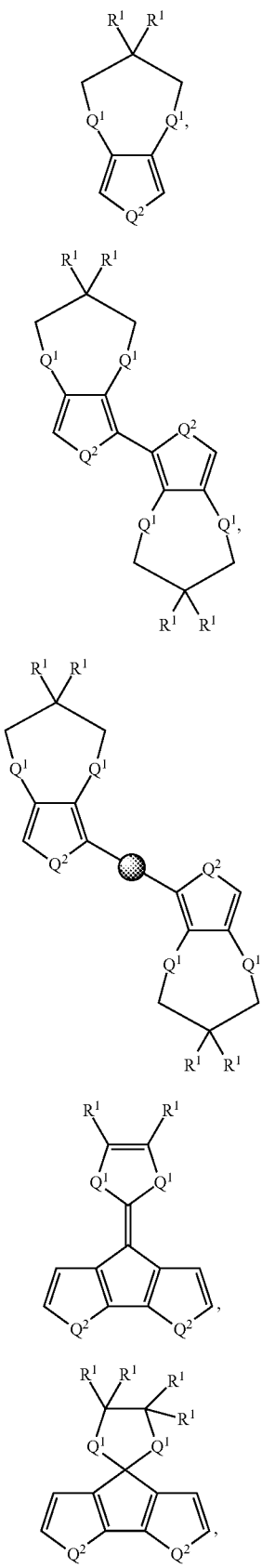

wherein
each occurrence of $Q^1$ is independently S, O, or Se;
$Q^2$ is S, O, or N—$R^2$;
each occurrence of $Q^3$ is independently CH or N;
$Q^4$ is $C(R^1)_2$, S, O, or N—$R^2$;
each occurrence of $Q^5$ is independently $CH_2$, S, or O;
each occurrence of $R^1$ is independently hydrogen, $C_1$-$C_{12}$ alkyl, $C_1$-$C_{12}$ alkyl-OH, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;
$R^2$ is hydrogen or $C_1$-$C_6$ alkyl;
each occurrence of $R^3$, $R^4$, $R^5$, and $R^6$ independently is hydrogen; optionally substituted $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl;
each occurrence of $R^7$ is an electron withdrawing group;
each occurrence of $R^8$ is independently hydrogen, $C_1$-$C_6$ alkyl, or cyano;
each occurrence of $R^9$ is independently $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, —$C_1$-$C_6$ alkyl-O-aryl, or N—$R^2$;
each occurrence of $R^{10}$ is independently $C_1$-$C_{12}$ alkyl, $C_1$-$C_{12}$ haloalkyl, aryl, —$C_1$-$C_6$ alkyl-O—$C_1$-$C_6$ alkyl, or —$C_1$-$C_6$ alkyl-O-aryl;
E is O or $C(R^7)_2$;
⬤ represents an aryl;
⬤ is $C_2$, $C_4$, or $C_6$ alkenylene, an aryl or heteroaryl; and
g is 0, 1, 2, or 3.

6. The device of claim 1, wherein the combination of crosslinked gel electrolyte composition and electroactive monomer further comprises a conducting oligomer, a conducting precursor polymer, a viologen, or a combination thereof.

7. The device of claim 1, wherein the at least two electrodes are indium-doped tin oxide (ITO) coated substrates.

8. The device of claim 1, further comprising a reference electrode.

9. The device of claim 1, further comprising a potential source in electrical connection with the at least two electrodes.

10. The device of claim 1, wherein the device is an electrochromic device, an organic thin-film transistor, an organic light-emitting diode, or an organic photovoltaic cell.

* * * * *